US011994021B2

United States Patent
Vehra et al.

(10) Patent No.: US 11,994,021 B2
(45) Date of Patent: May 28, 2024

(54) DOWNHOLE WIRE INTEGRITY AND PROPAGATION DELAY DETERMINATION BY SIGNAL REFLECTION

(71) Applicant: HALLIBURTON ENERGY SERVICES, INC., Houston, TX (US)

(72) Inventors: Imran Sharif Vehra, Kingwood, TX (US); Christopher Golla, Kingwood, TX (US); Matthew Chase Griffing, Kingwood, TX (US); Zinovy B. Krugliak, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 944 days.

(21) Appl. No.: 16/963,460

(22) PCT Filed: Feb. 20, 2018

(86) PCT No.: PCT/US2018/018810
§ 371 (c)(1),
(2) Date: Jul. 20, 2020

(87) PCT Pub. No.: WO2019/164476
PCT Pub. Date: Aug. 29, 2019

(65) Prior Publication Data
US 2021/0047918 A1    Feb. 18, 2021

(51) Int. Cl.
*E21B 47/12* (2012.01)
*E21B 19/18* (2006.01)
(Continued)

(52) U.S. Cl.
CPC .............. *E21B 47/12* (2013.01); *G01R 31/11* (2013.01); *G01V 3/18* (2013.01); *E21B 19/18* (2013.01)

(58) Field of Classification Search
CPC ......... E21B 47/12; E21B 19/18; G01R 31/11; G01V 3/18
See application file for complete search history.

(56) References Cited

U.S. PATENT DOCUMENTS 6,249,122 B1    6/2001    Vail, III et al.
7,228,900 B2    6/2007    Schultz et al.
(Continued)

FOREIGN PATENT DOCUMENTS

GB          2435358 A     8/2007

OTHER PUBLICATIONS

Examination Report; Canadian Application No. 3,086,586; dated Jun. 29, 2022.
(Continued)

*Primary Examiner* — Crystal J. Lee
(74) *Attorney, Agent, or Firm* — NOVAK DRUCE CARROLL LLP

(57) ABSTRACT

An apparatus, method, and system for determining the propagation delay for a downhole wire and/or for monitoring the integrity of a downhole wire. The apparatus includes a first tool component and a second tool component spaced apart from the first tool component and communicatively coupled by a wire. The tool components include impedance altering devices configured to alter, for a predetermined period of time, either the source impedance at a first termination point of the wire and/or the load impedance at a second termination point of the wire sufficient to generate a characteristic signal reflection upon the transmission of a signal along a length of the wire between the first tool component and the second tool component.

25 Claims, 9 Drawing Sheets

(51) Int. Cl.
    *G01R 31/11*    (2006.01)
    *G01V 3/18*     (2006.01)

(56) References Cited

U.S. PATENT DOCUMENTS

| | | | |
|---|---|---|---|
| 8,269,647 B2* | 9/2012 | Solis | E21B 47/04 |
| | | | 324/519 |
| 9,632,203 B2 | 4/2017 | Hopper et al. | |
| 2005/0022987 A1 | 2/2005 | Green | |
| 2012/0126992 A1 | 5/2012 | Rodney | |
| 2016/0251952 A1 | 9/2016 | Tran et al. | |
| 2016/0349405 A1* | 12/2016 | San Martin | G01V 3/18 |

OTHER PUBLICATIONS

Canadian Office Action for CA Application No. 3,086,586, dated Aug. 17, 2021, 5 pages.
International Search Report and Written Opinion; PCT Application No. PCT/US2018/018810; dated Oct. 30, 2018.

* cited by examiner

| Case | Name | $Z_S$ | $Z_L$ | Wave |
|---|---|---|---|---|
| 1 | Step Induced Natural Ring | High ($>>Z_0$) | Low ($<<Z_0$) | |
| 2 | Positive Step Reflection | $\approx Z_0$ | High ($>>Z_0$) | |
| 3 | Negative Step Reflection | $\approx Z_0$ | Low ($<<Z_0$) | |
| 4 | Positive Pulse Reflection | $\approx Z_0$ | High ($>>Z_0$) | |

FIG. 9

DOWNHOLE WIRE INTEGRITY AND PROPAGATION DELAY DETERMINATION BY SIGNAL REFLECTION

CROSS-REFERENCE TO RELATED APPLICATIONS

This application is a national stage entry of PCT/US2018/018810 filed Feb. 20, 2018, said application is expressly incorporated herein by reference in its entirety.

FIELD

The present disclosure relates to monitoring the condition and propagation delay of downhole wires in subterranean wellbores. In particular, the present disclosure relates to devices, methods, and systems, for monitoring the integrity of downhole wires and determining the propagation delay along a downhole wire using reflected signals.

BACKGROUND

Wellbores are drilled into the earth for a variety of purposes including tapping into hydrocarbon bearing formations to extract the hydrocarbons for use as fuel, lubricants, chemical production, and other purposes. In order to facilitate processes and operations in the wellbore, various tools may be conveyed downhole. Wires may be coupled with downhole tools in order to transmit power to the tool as well as to convey telemetry data or control signals between the downhole tool and the surface. Wires may also couple one downhole tool with another downhole tool or may couple two or more different components of a downhole tool with each other.

Wires between different downhole tool components or between downhole tools and the surface may be characterized by a propagation delay in signal transmission that may need to be corrected or accounted for during particular downhole applications. In some cases, the propagation delay may introduce a significant phase offset or drift error that may be affected by the distance between downhole tool components, the type of wire, parasitic effects, and temperature.

Additionally, during the lifetime of the tool, wires may degrade or become damaged due to mechanical stress or environmental conditions, eventually resulting in a fault in the wire that may lead to poor downhole tool performance or downhole tool failure. As a result, early failure detection of downhole wires and determination of the propagation delay along downhole wires is desirable.

BRIEF DESCRIPTION OF THE DRAWINGS

In order to describe the manner in which the advantages and features of the disclosure can be obtained, reference is made to embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 9 is an illustration depicting different cases that may provide for manipulation of the source and load impedance on the line so as to generate a characteristic reflection allowing for propagation delay determination, according to an exemplary embodiment of the present disclosure.

DETAILED DESCRIPTION

Figure 1:
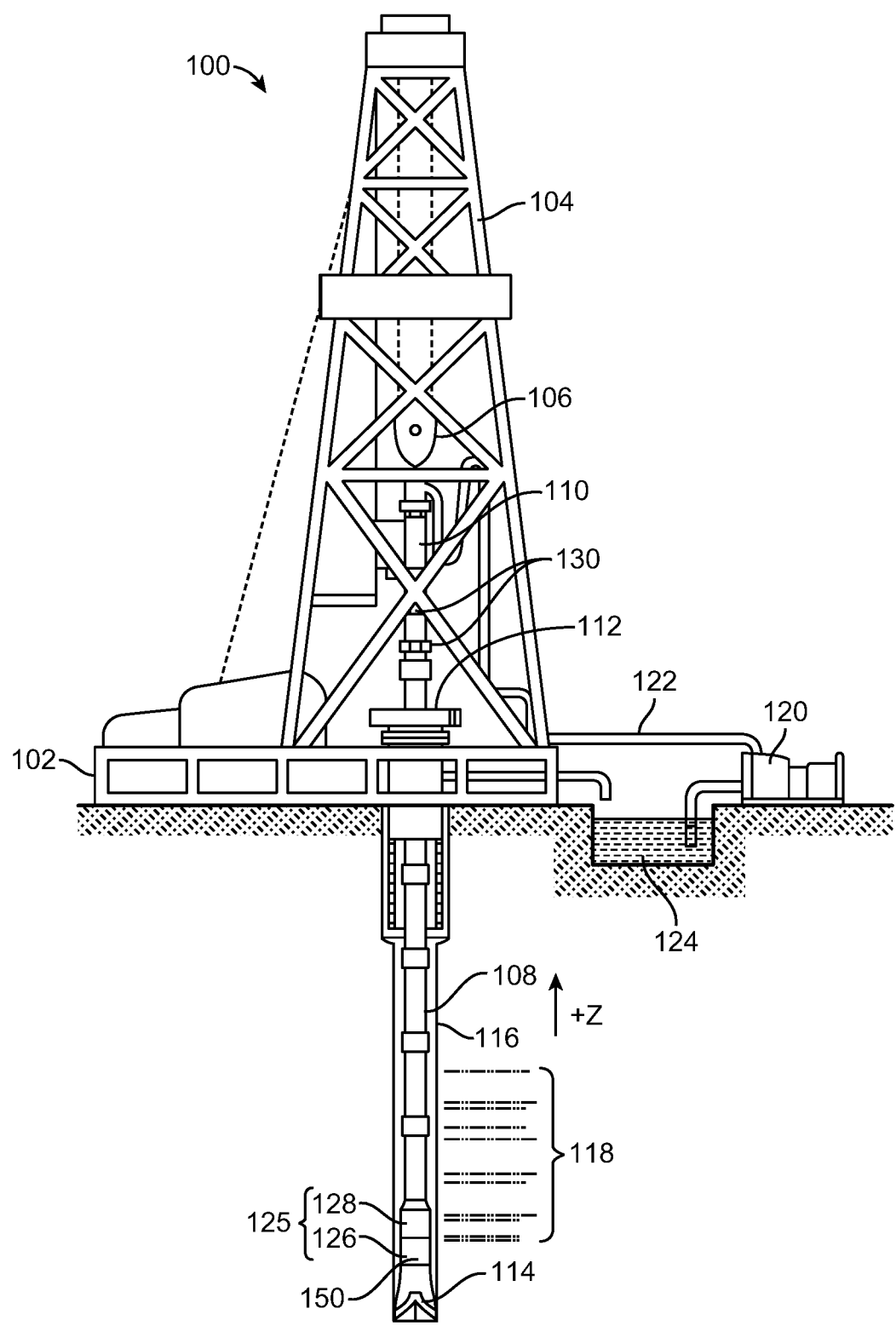
FIG. 1 is a diagram of a logging while drilling (LWD) wellbore operating environment in which the presently disclosed apparatus, method, and system may be deployed, according to an exemplary embodiment of the present disclosure.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

It should be understood at the outset that although illustrative implementations of one or more embodiments are illustrated below, the disclosed apparatus and methods may be implemented using any number of techniques. The disclosure should in no way be limited to the illustrative implementations, drawings, and techniques illustrated herein, but may be modified within the scope of the appended claims along with their full scope of equivalents.

Unless otherwise specified, any use of any form of the terms "connect," "engage," "couple," "attach," or any other term describing an interaction between elements is not meant to limit the interaction to direct interaction between the elements and also may include indirect interaction between the elements described. In the following discussion and in the claims, the terms "including" and "comprising" are used in an open-ended fashion, and thus should be interpreted to mean "including, but not limited to . . . ". Reference to up or down will be made for purposes of description with "up," "upper," "upward," "upstream," or "uphole" meaning toward the surface of the wellbore and with "down," "lower," "downward," "downstream," or "downhole" meaning toward the terminal end of the well, regardless of the wellbore orientation. As used herein, the term "wire" means any electrically conductive member capable of carrying power, communication signals, and/or data to a downhole tool or between components of a downhole tool. The term "wire" is further used herein to refer equally to a single wire or a plurality of wire segments connected end-to-end. The term "wire" is also used herein to refer to two wires, possibly braided or twisted together (twisted pair), in which one wire carries a forward signal and the other wire provides the signal return path. As used herein, the term "wire" may include a shield around the wire, such as with a coax, or may be surrounded by the tool body or chassis. The term "wire" may also refer to a transmission line, such as a pair of electrical conductors carrying an electrical signal from one place to another between the different subs/collars. The term "wire" may also refer to a transmission line having a transmission path that includes passive circuitry, filtering components, and/or signal conditioning components. The various characteristics described in more detail below, will be readily apparent to those skilled in the art with the aid of this disclosure upon reading the following detailed description, and by referring to the accompanying drawings. The term "clock signal," as used herein, refers to any signal that may be transmitted for the purpose of determining a propagation delay or wire integrity characteristic for a length of wire between two tool components.

The present disclosure generally relates to an apparatus, method, and system for determining the propagation delay for a downhole wire and/or monitoring the integrity of a downhole wire. The propagation delay determined according to the present disclosure, for a wire coupling two or more tool components, may be used, for example, to correct phase offset or drift error that may occur due to tool assembly variations and temperature effects, in real time during downhole operation.

In addition, the presently disclosed apparatus, method, and system provides for early failure detection and fault location for downhole wires that may affect tool performance or cause tool failure. For example, the present disclosure provides for diagnostic tools determining bus/transmission line integrity and fault location thus enabling quick identification of a faulty collar or tool joint. The present disclosure provides for monitoring the integrity of downhole wires that connect one or more tool components as well as downhole wires that connect tools or the BHA to the surface.

According to the present disclosure, an apparatus is provided which includes a first tool component and a second tool component spaced apart from the first tool component. A wire may communicatively couple the first tool component and the second tool component. The wire has at least a first termination point and a second termination point. The wire also has a characteristic line impedance. The first tool component may be coupled with a first termination point of the wire and the second tool component may be coupled with the second termination point of the wire. The first termination point has a source impedance while the second termination point has a load impedance.

The first tool component may include an impedance altering device that is configured to alter, for a first predetermined period of time, the source impedance and/or the load impedance sufficient to generate a characteristic signal reflection upon the transmission of a signal along a length of wire between the first tool component and the second tool component.

The first tool component may be configured to transmit a clock signal along the length of wire between the first tool component and the second tool component during the first predetermined period of time. The first tool component may also be configured to receive one or more reflected clock signals reflected during the first predetermined period of time. In at least some instances, the apparatus may further include a computing device coupled with the first tool component. The computing device may be configured to determine a propagation delay based on one or more of the reflected clock signals. In such cases, the propagation delay corresponds to the time of propagation along a length of the wire between the first termination point and the second termination point. The computing device may be further configured to determine a wire integrity characteristic based on one or more of the reflected clock signals.

In at least some instances, the impedance altering device may be configured to alter the source impedance and/or the load impedance so as to generate an impedance mismatch between the source impedance, the load impedance, and the characteristic line impedance (Zo) sufficient to generate a characteristic signal reflection upon the transmission of a signal along a length of wire between the first tool component and the second tool component. In some cases, the impedance altering device may be configured to alter the source impedance and/or the load impedance so as to cause the source impedance to be greater than the load impedance. In other cases, the impedance altering device may be configured to alter the source impedance and/or the load impedance so as to cause the source impedance to be substantially the same as the line impedance and the load impedance to be greater than the source impedance.

The impedance altering device may be, for example, a resistor, a capacitor, an inductor, an impedance-changing transformer, active circuitry (such as transistors, op-amps, switches, etc.), or any combination of these.

According to at least one aspect of the present disclosure, the first tool component may include a signal transmitting device capable of transmitting a signal to the second tool component in order to cause the second tool component to generate a short along a length of wire between the first termination point and the second termination point.

According to at least one aspect of the present disclosure, an apparatus is also provided which includes a first tool component and a second tool component spaced apart from the first tool component. A wire may communicatively couple the first tool component and the second tool component. The first tool component is configured to transmit a command signal to the second tool component and the second tool component is configured to, upon receiving the command signal, generate a short (or low impedance, <<Zo) for a first predetermined period of time along a length of the wire between the first tool component and the second tool component. The first tool component is further configured to transmit a clock signal along the length of wire between the first tool component and the second tool component during the first predetermined period of time. The first tool component is also configured to receive one or more reflected clock signals reflected during the first predetermined period of time. In at least some instances, a short circuit may be generated along a length of the wire between the first tool component and the second tool component by placing or activating a shunt on the wire (via a switch). The shunt may be a device which allows electric current to pass around another point on the circuit by creating a low resistance path.

According to at least one aspect of the present disclosure, the first tool component is a transmitter of a resistivity logging tool. In such cases, the second tool component is a receiver of the resistivity logging tool. The third tool component may be a second receiver or a second transmitter of the resistivity logging tool. In other cases, the first tool component, the second tool component, and the third tool component may be part of an NMR logging tool, an acoustic tool, a gamma ray tool, a neutron tool, a dielectric tool, an electromagnetic induction tool, and any combination thereof.

FIG. 1 illustrates a diagrammatic view of a logging while drilling (LWD) wellbore operating environment 100 in which the presently disclosed apparatus, method, and system, may be deployed in accordance with certain exemplary embodiments of the present disclosure. As depicted in FIG. 1, a drilling platform 102 is equipped with a derrick 104 that supports a hoist 106 for raising and lowering a drill string 108. The hoist 106 suspends a top drive 110 suitable for rotating the drill string 108 and lowering the drill string 108 through the well head 112. Connected to the lower end of the drill string 108 is a drill bit 114. As the drill bit 114 rotates, the drill bit 114 creates a wellbore 116 that passes through various formations 118. A pump 120 circulates drilling fluid through a supply pipe 122 to top drive 110, down through the interior of drill string 108, through orifices in drill bit 114, back to the surface via the annulus around drill string 108, and into a retention pit 124. The drilling fluid transports cuttings from the wellbore 116 into the pit 124 and aids in maintaining the integrity of the wellbore 116. Various materials can be used for drilling fluid, including oil-based fluids and water-based fluids.

As depicted in FIG. 1, logging tools 126 are integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 130 and to receive commands from the surface. In at least some cases, the telemetry sub 128 communicates with a surface receiver 130 using mud pulse telemetry. In some instances, the telemetry sub 128 does not communicate with the surface, but rather stores logging data for later retrieval at the surface when the logging assembly is recovered.

Each of the logging tools 126 may include a plurality of tool components, spaced apart from each other, and communicatively coupled with one or more wires. The logging tools 126 may also include one or more computing devices 150 communicatively coupled with one or more of the plurality of tool components by one or more wires. The computing device 150 may be configured to control or monitor the performance of the tool, process logging data, and/or carry out the methods of the present disclosure.

In at least some instances, one or more of the logging tools 126 may communicate with a surface receiver 130 by a wire, such as wired drillpipe. In other cases, the one or more of the logging tools 126 may communicate with a surface receiver 130 by wireless signal transmission. In at least some cases, one or more of the logging tools 126 may receive electrical power from a wire that extends to the surface, including wires extending through a wired drillpipe.

Figure 2:
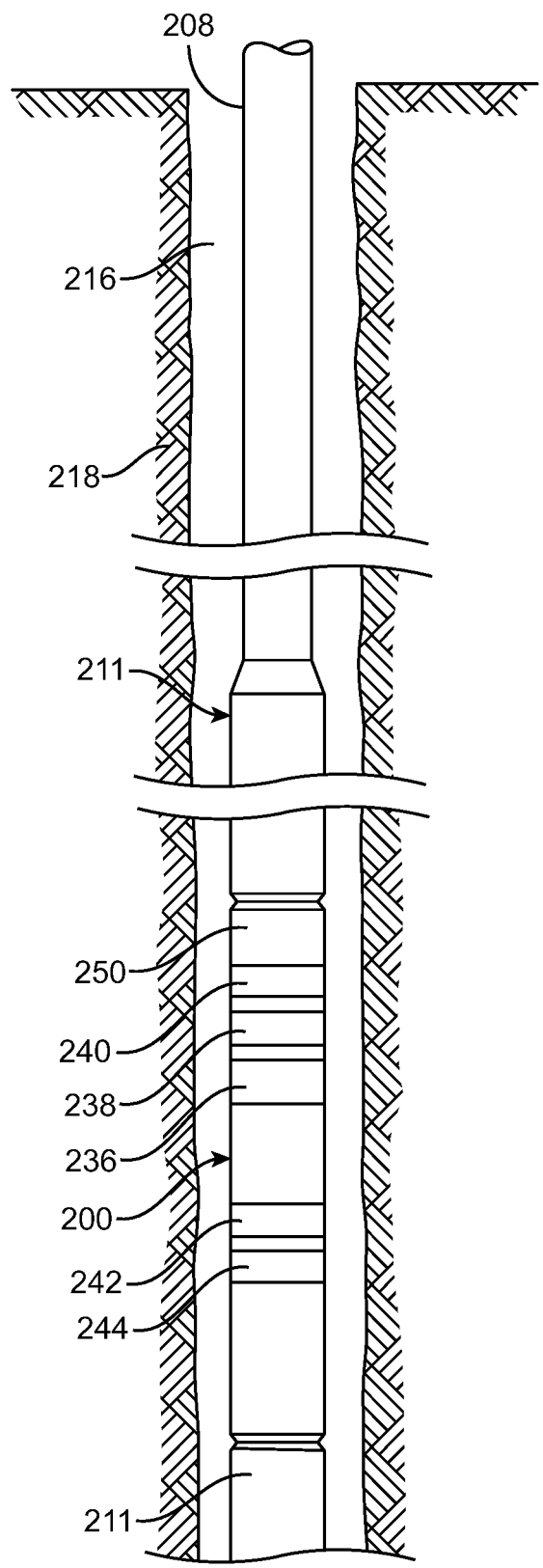
FIG. 2 is a diagram of a LWD resistivity logging tool in which the presently disclosed apparatus, method, and system may be deployed, according to an exemplary embodiment of the present disclosure.

Additionally, logging tools 126 may include a resistivity logging tool, for example, the LWD resistivity logging tool 200 depicted in FIG. 2. In other cases, logging tool 126 may be an NMR logging tool, an acoustic tool, a gamma ray tool, a neutron tool, a dielectric tool, an electromagnetic induction tool, or any combination thereof. Resistivity logging tools may be used to provide an indication of the electrical resistivity of rock formations surrounding a wellbore. The electrical resistivity data is useful in ascertaining the presence or absence of hydrocarbons in the subterranean formations. A typical resistivity tool includes a transmitter antenna and at least two receiver antennas located at different distances from the transmitter antenna along the axis of the tool. The transmitter antenna is used to transmit electromagnetic waves into the surrounding formation. In turn, the magnetic field in the formation induces an electrical voltage in each receiver antenna. Due to geometric spreading and absorption by the surrounding earth formation, the induced voltages in the two receiving antennas have different phases and amplitudes. The phase difference and amplitude ratio (attenuation) of the induced voltages in the receiver antenna are indicative of the resistivity of the formation.

FIG. 2 illustrates a diagrammatic view of a LWD resistivity logging tool 200 in which the presently disclosed apparatus, method, and system, may be deployed in accordance with certain exemplary embodiments of the present disclosure. As depicted in FIG. 2, resistivity logging tool 200 is suspended in a wellbore 216 within an earth formation 218 on a string of drill pipe 208. Drill string 208 includes one or more drill collars 211. Electromagnetic transmitters (antennas) 236, 238, and 240 are spaced along the length of resistivity logging tool 200 from electromagnetic receivers (antennas) 242 and 244. As shown in FIG. 2, transmitters 236, 238, 240 and receivers 242, 244 are mounted in recesses in resistivity logging tool 200. One or more drill collars 211 are threadably connected to the lower end of resistivity logging tool 200 and a drill bit (not shown) is threadably connected to the lowest drill collar 211.

The resistivity logging tool 200 also includes computing device 250 communicatively coupled with transmitters 236, 238, 240 and receivers 242, 244 by one or more wires (not shown). Computing device 250 is configured to process the signals received by receivers 242, 244 thereby converting the received signals into a log or another indication of formation resistivity. The processed signals can be recorded in an electronic storage device within resistivity logging tool 200 or transmitted to a surface receiver, such as surface receiver 130 in FIG. 1, by a telemetry system (not shown) for concurrent processing and readout at the surface. The telemetry system may be, for example, a mud-pulse telemetry system which generates mud pulses indicative of the processed signals that can be detected by a surface receiver.

The computing device 250, included in the resistivity logging tool 200, is also configured to carry out methods for monitoring the integrity of a downhole wire and determine the propagation delay for a downhole wire, in accordance with the present disclosure. Computing device 250 may include any suitable computer, controller, or data processing apparatus capable of being programmed to carry out the method, system, and apparatus as further described herein.

Figure 3:
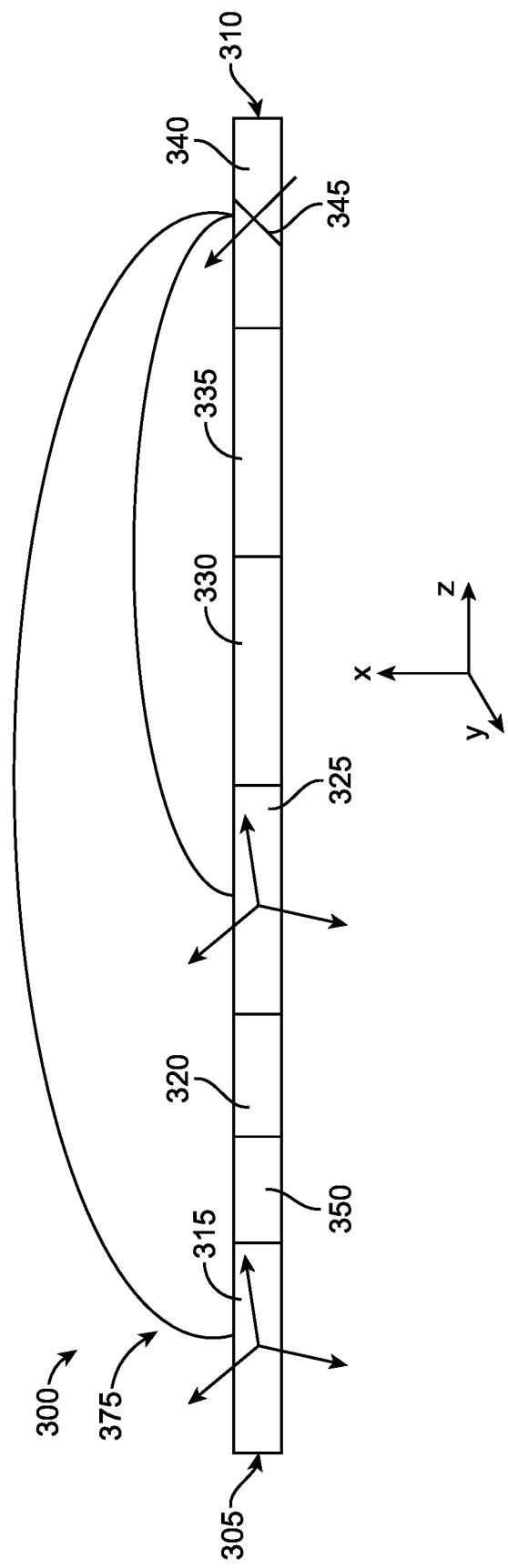
FIG. 3 is a diagram of a bottomhole assembly (BHA) having LWD resistivity logging tools that may be deployed as part of an ultra-deep resistivity tool, according to an exemplary embodiment of the present disclosure.

FIGS. 1 and 2 describe LWD propagation resistivity tools capable of performing shallow resistivity measurements. The presently disclosed apparatus and techniques may also be employed as part of an ultra-deep resistivity logging tool, such as that depicted in FIG. 3. FIG. 3 is a diagram of a BHA 300 having an uphole end 305 and a downhole end 310. The BHA 300 includes LWD resistivity logging tools that may be deployed as part of an ultra-deep resistivity logging tool, according to an exemplary embodiment of the present disclosure. As shown in FIG. 3, BHA 300 includes an ultra-deep resistivity logging tool 375 having a transmitter sub 340 and multiple/independent receiver subs 315, 325 distributed along the length of the BHA 300. The ultra-deep resistivity logging tool 375 includes transmitter sub 340 spaced apart from receiver subs 315, 325 by between about 25 feet to about 125 feet. The transmitter sub 340 and antenna 345 are oriented to have field components in X, Y, and Z directions. There may be a single transmitter antenna or multiple transmitter antennas. The ultra-deep resistivity logging tool 375 transmits at low frequencies in the range of from about 100 Hz to about 100 kHz. The ultra-deep resistivity logging tool 375 utilizes arrays of multiple receiver antennas with differing orientations to provide tri-axial sensitivity to obtain all transmitter-receiver coupling components for each receiver sub. The ultra-deep resistivity logging tool 375 exploits these long or deep spacings, low frequencies, and various transmitter-receiver antenna coupling components and orientations to determine or identify multiple geological boundaries as far as approximately 100 feet from the borehole or ahead of the drill bit.

The BHA 300 may also include additional LWD tools 320, 330 in-between the ultra-deep resistivity tool subs in order to help create the large spacings and make efficient use of the BHA 300. The BHA 300 may also include as a shallow resistivity tool 335 as shown if FIG. 2. Generally, the shallow resistivity tool 335 is located in the BHA 300 close to the ultra-deep resistivity logging tool 375 subs 315, 325, 340 to assist with the measurement and inversion of the data into a representation of the formation. The transmitter sub 340 and receiver subs 315, 325 are communicatively coupled by wire segments (not shown).

The ultra-deep resistivity logging tool 375 also includes computing device 350 communicatively coupled with transmitter& 340 and receivers 315, 325 by one or more wires (not shown). Computing device 350 is configured to process the signals received by receivers 315, 325 thereby converting the received signals into a log or another indication of formation resistivity. The processed signals can be recorded in an electronic storage device within ultra-deep resistivity logging tool 375 or transmitted to a surface receiver, such as surface receiver 130 in FIG. 1, by a telemetry system (not shown) for concurrent processing and readout at the surface. The telemetry system may be, for example, a mud-pulse telemetry system which generates mud pulses indicative of the processed signals that can be detected by a surface receiver.

The computing device 350, included in the ultra-deep resistivity logging tool 375, is also configured to carry out methods for monitoring the integrity of a downhole wire and determine the propagation delay for a downhole wire, in accordance with the present disclosure. Computing device 350 may include any suitable computer, controller, or data processing apparatus capable of being programmed to carry out the method, system, and apparatus as further described herein.

Computing devices 150, 250, 350, 450, 550, 650 may include any suitable computer, controller, or data processing apparatus capable of being programmed to carry out the method, system, and apparatus as further described herein.

In at least some instances, computing devices 150, 250, 350, 450, 550, 650 include a conventional system bus computing system architecture wherein the components of the system are in electrical communication with each other using a bus. The system can include a processing unit (CPU or processor) and a system bus that couples various system components including the system memory, such as read only memory (ROM) and random access memory (RAM), to the processor. The system can include a cache of high-speed memory connected directly with, in close proximity to, or integrated as part of the processor. The system can copy data from the memory and/or the storage device to the cache for quick access by the processor. In this way, the cache can provide a performance boost that avoids processor delays while waiting for data. These and other modules can control or be configured to control the processor to perform various actions. Other system memory may be available for use as well. The memory can include multiple different types of memory with different performance characteristics. It can be appreciated that the disclosure may operate on a computing device with more than one processor or on a group or cluster of computing devices networked together to provide greater processing capability. The processor can include any general purpose processor and a hardware module or software module, such as first module, second module, and third module stored in storage device, configured to control the processor as well as a special-purpose processor where software instructions are incorporated into the actual processor design. The processor may essentially be a completely self-contained computing system, containing multiple cores or processors, a bus, memory controller, cache, etc. A multi-core processor may be symmetric or asymmetric.

The system bus may be any of several types of bus structures including a memory bus or a memory controller, a peripheral bus, and a local bus using any of a variety of bus architectures. A basic input/output (BIOS) stored in ROM or the like, may provide the basic routine that helps to transfer information between elements within the computing device, such as during start-up. The computing device further includes storage devices or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device can include software modules for controlling the processor. The system can include other hardware or software modules. The storage device is connected to the system bus by a drive interface. The drives and the associated computer-readable storage devices provide non-volatile storage of computer-readable instructions, data structures, program modules and other data for the computing device. In one aspect, a hardware module that performs a particular function includes the software components stored in a tangible computer-readable storage device in connection with the necessary hardware components, such as the processor, bus, and so forth, to carry out a particular function. In the alternative, the system can use a processor and computer-readable storage device to store instructions which, when executed by the processor, cause the processor to perform operations, a method or other specific actions. The basic components and appropriate variations can be modified depending on the type of device, such as whether the device is a small, handheld computing device, a desktop computer, or a computer server. When the processor executes instructions to perform "operations", the processor can perform the operations directly and/or facilitate, direct, or cooperate with another device or component to perform the operations.

To enable user interaction with the computing device, an input device can represent any number of input mechanisms, such as a microphone for speech, a touch-sensitive screen for gesture or graphical input, keyboard, mouse, motion input, speech and so forth. An output device can also be one or more of a number of output mechanisms known to those of skill in the art. In some instances, multimodal systems can enable a user to provide multiple types of input to communicate with the computing device. The communications interface can generally govern and manage the user input and system output. There is no restriction on operating on any particular hardware arrangement and therefore the basic features here may easily be substituted for improved hardware or firmware arrangements as they are developed.

Storage device is a non-volatile memory and can be a hard disk or other types of computer readable media which can store data that are accessible by a computer, such as magnetic cassettes, flash memory cards, solid state memory devices, digital versatile disks (DVDs), cartridges, RAMs, ROM, a cable containing a bit stream, and hybrids thereof.

The logical operations for carrying out the disclosure herein may include: (1) a sequence of computer implemented steps, operations, or procedures running on a programmable circuit with a general use computer, (2) a sequence of computer implemented steps, operations, or procedures running on a specific-use programmable circuit; and/or (3) interconnected machine modules or program engines within the programmable circuits. Computing devices 150, 250, 350, 450, 550, 650 can practice all or part of the recited methods, can be a part of the recited systems, and/or can operate according to instructions in the recited tangible computer-readable storage devices.

One or more parts of the example computing devices, up to and including the entire computing device, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization compute layer can operate on top of a physical compute layer. The virtualization compute layer can include one or more of a virtual machine, an overlay network, a hypervisor, virtual switching, and any other virtualization application.

The processor can include all types of processors disclosed herein, including a virtual processor. However, when referring to a virtual processor, the processor includes the software components associated with executing the virtual processor in a virtualization layer and underlying hardware necessary to execute the virtualization layer. The system can include a physical or virtual processor that receives instructions stored in a computer-readable storage device, which causes the processor to perform certain operations. When referring to a virtual processor, the system also includes the underlying physical hardware executing the virtual processor.

Computing devices 150, 250, 350, 450, 550, 650 may also have a chipset architecture that can be used in executing the described method and generating and displaying a graphical user interface (GUI). Computing devices 150, 250, 350, 450, 550, 650 can be computer hardware, software, and firmware that can be used to implement the disclosed technology. Computing devices 150, 250, 350, 450, 550, 650 can include a processor, representative of any number of physically and/or logically distinct resources capable of executing software, firmware, and hardware configured to perform identified computations. Processor can communicate with a chipset that can control input to and output from processor. Chipset can output information to output device, such as a display, and can read and write information to storage device, which can include magnetic media, and solid state media. Chipset can also read data from and write data to RAM. A bridge for interfacing with a variety of user interface components can include a keyboard, a microphone, touch detection and processing circuitry, a pointing device, such as a mouse, and so on. In general, inputs to computing devices 150, 250, 350, 450, 550, 650 can come from any of a variety of sources, machine generated and/or human generated.

Chipset can also interface with one or more communication interfaces that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor analyzing data stored in storage or RAM. Further, the machine can receive inputs from a user via user interface components and execute appropriate functions, such as browsing functions by interpreting these inputs using processor.

It can be appreciated that computing devices 150, 250, 350, 450, 550, 650 can have more than one processor or be part of a group or cluster of computing devices networked together to provide processing capability. For example, the processor can include multiple processors, such as a system having multiple, physically separate processors in different sockets, or a system having multiple processor cores on a single physical chip. Similarly, the processor can include multiple distributed processors located in multiple separate computing devices, but working together such as via a communications network. Multiple processors or processor cores can share resources such as memory or the cache, or can operate using independent resources. The processor can include one or more of a state machine, an application specific integrated circuit (ASIC), or a programmable gate array (PGA) including a field PGA (FPGA).

Methods according to the aforementioned description can be implemented using computer-executable instructions that are stored or otherwise available from computer readable media. Such instructions can comprise instructions and data which cause or otherwise configured a general purpose computer, special purpose computer, or special purpose processing device to perform a certain function or group of functions. Portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with non-volatile memory, networked storage devices, and so on.

For clarity of explanation, in some instances the present technology may be presented as including individual functional blocks including functional blocks comprising devices, device components, steps or routines in a method embodied in software, or combinations of hardware and software. The functions these blocks represent may be provided through the use of either shared or dedicated hardware, including, but not limited to, hardware capable of executing software and hardware, such as a processor, that is purpose-built to operate as an equivalent to software executing on a general purpose processor. For example, the functions of one or more processors may be provided by a single shared processor or multiple processors. (Use of the term "processor" should not be construed to refer exclusively to hardware capable of executing software.) Illustrative embodiments may include microprocessor and/or digital signal processor (DSP) hardware, ROM for storing software performing the operations described below, and RAM for storing results. Very large scale integration (VLSI) hardware embodiments, as well as custom VLSI circuitry in combination with a general purpose DSP circuit, may also be provided.

The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing methods according to these disclosures can comprise hardware, firmware and/or software, and can take any of a variety of form factors. Such form factors can include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device.

The instructions, media for conveying such instructions, computing resources for executing them, and other structures for supporting such computing resources are means for providing the functions described in the present disclosure.

Figure 4:
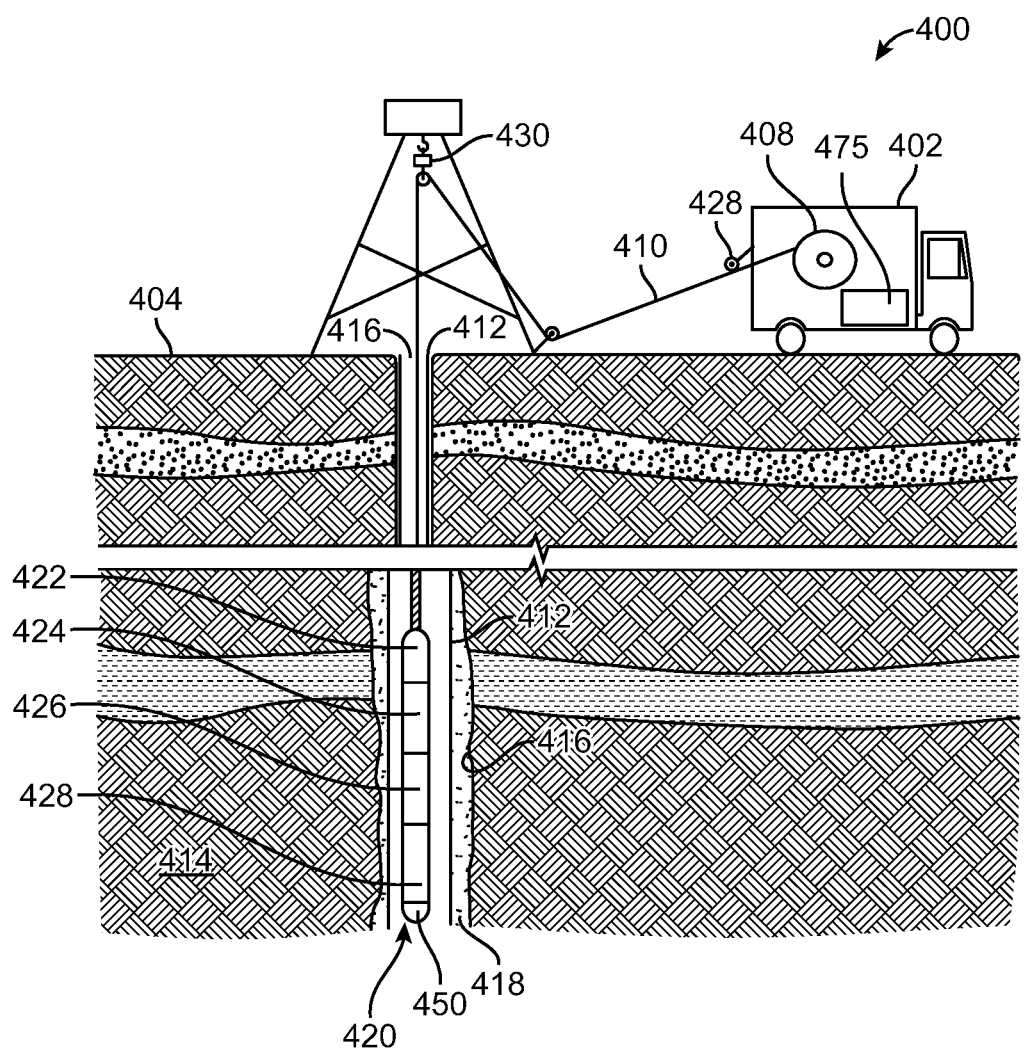
FIG. 4 is a diagram depicting a conveyance (wireline) tool wellbore operating environment in which the presently disclosed apparatus, method, and system may be deployed, according to an exemplary embodiment of the present disclosure.

FIG. 4 illustrates a diagrammatic view of a tool wellbore operating environment 400 in which the presently disclosed apparatus, method, and system, may be deployed in accordance with certain exemplary embodiments of the present disclosure. As depicted in FIG. 4, the drill string has been removed from the wellbore 416 and a tool 420 has been lowered into the wellbore 416 using conveyance 410. The conveyance 410 may include wires (one or more wires), slickline, cables, or the like, as well as tubular conveyances such as coiled tubing, joint tubing, or other tubulars, and may include a downhole tractor. In the field, the conveyance 410 may also be referred to as wireline, in which case tool 420 may be referred to as a wireline tool. A truck or skid 402 on the Earth's surface 404 houses a surface computer system 475 and a winch 408 from which a conveyance 410 extends into a wellbore 416 drilled into a formation 414. The wellbore 416 is lined with a casing 412. The space between the wellbore 416 and casing 412 is filled with cement 418.

In addition to conveying the tool 420 into the wellbore 416, the conveyance 410 may provide a link for power and communications between surface equipment, including surface computer system 475, and the tool 420. The tool 420 may have a local power supply, such as batteries, downhole generator and the like. When employing non-conductive cable, coiled tubing, pipe string, or downhole tractor, communication may be supported using, for example, wireless protocols (e.g. EM, acoustic, etc.), and/or measurements and logging data may be stored in local memory for subsequent retrieval. As the tool 420 is raised or lowered within the wellbore 416, a depth encoder 428 may provide a measured depth of the extended conveyance (extended cable for instance). The wellbore operating environment 400 may also include a tension load cell 430 that measures tension in the conveyance 410 at the surface 404.

As depicted in FIG. 4, tool 420 includes a plurality of tool components 422, 424, 426, 428 spaced apart from each other. Each of the tool components 422, 424, 426, 428 are communicatively coupled with one or more wires (not shown). Tool 420 may also include one or more computing devices 450 communicatively coupled with one or more of the tool components 422, 424, 426, 428 by one or more wires (not shown). The computing device 450 may be configured to control or monitor the performance of the tool, process tool data and/or carry out the methods of the present disclosure. Computing device 450 may include the computing system 300 or computer system 350 shown in FIGS. 3A and 3B and described above.

The tool 420 depicted in FIG. 4 may also be a logging tool. In such cases, conveyance 410 suspends the logging tool within the wellbore 416 to measure formation data as the logging tool is raised or lowered by conveyance 410.

Figure 5:
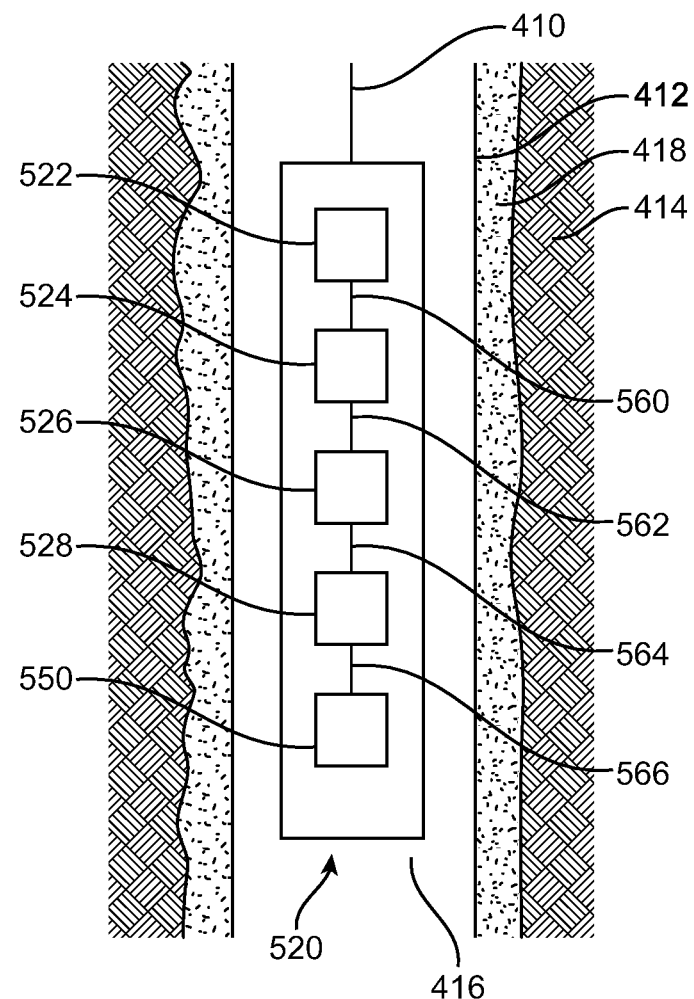
FIG. 5 is a cross-sectional view of a resistivity logging tool in which the presently disclosed apparatus, method, and system may be deployed, according to an exemplary embodiment of the present disclosure.

In at least some instances, the tool 420 may be a resistivity logging tool, for example, the resistivity logging tool 520 depicted in FIG. 5. In such cases, the tool components 422, 424 may be, for example, transmitters of a resistivity logging tool and tool components 426, 428 may be receivers of the resistivity logging tool. In other cases, tool 420 may be an NMR logging tool, an acoustic tool, a gamma ray tool, a neutron tool, a dielectric tool, an electromagnetic induction tool, or any combination thereof.

FIG. 5 illustrates a cross-sectional view of a resistivity logging tool 520 in which the presently disclosed apparatus, method, and system, may be deployed in accordance with certain exemplary embodiments of the present disclosure. As depicted in FIG. 5, resistivity logging tool 520 includes transmitters 522, 524, receivers 526, 528, and computing device 550. The transmitters 522, 524 and receivers 526, 528 are communicatively coupled by wire segments 560, 562, and 564. Additionally, the computing device 550 is communicatively coupled with to transmitters 522, 524, and receivers 52, 528 via wire segment 566.

The computing device 550 may be configured to control or monitor the performance of the tool, process tool data and/or carry out the methods of the present disclosure. Computing device 550 may include the computing system 300 or computer system 350 shown in FIGS. 3A and 3B and described above.

The resistivity logging tool 520 may include any number of transmitters and receivers. Additionally, the transmitters and receivers may be in any order within the resistivity logging tool 520. Also, the computing device 550 may be located anywhere within the resistivity logging tool as long as it is communicatively coupled with the receivers and/or transmitters.

While the resistivity logging tool 520 depicted in FIG. 5 is illustrated as a conveyed tool, the present disclosure is equally well-suited to being employed with LWD resistivity logging tools that may be included in the BHA of a drill string. Furthermore, the previously described features of FIG. 5, including transmitters 522, 524, receivers 526, 528, computing device 550, and wire segments 560, 562, 564, 566, apply equally well to a LWD resistivity logging tool, for example, the resistivity logging tool 200 shown in FIG. 2.

While FIG. 5, depicts a resistivity logging tool as an exemplary downhole tool that may be employed in accordance with the present disclosure. Any downhole tool is within the spirit and scope of the present disclosure, so long as the downhole tool includes a plurality of tool components communicatively coupled by one or more wires. The apparatus, method, and system of the present disclosure is equally well-suited to other downhole tools having at least a first tool component and a second tool component communicatively coupled by a downhole wire.

Figure 6:
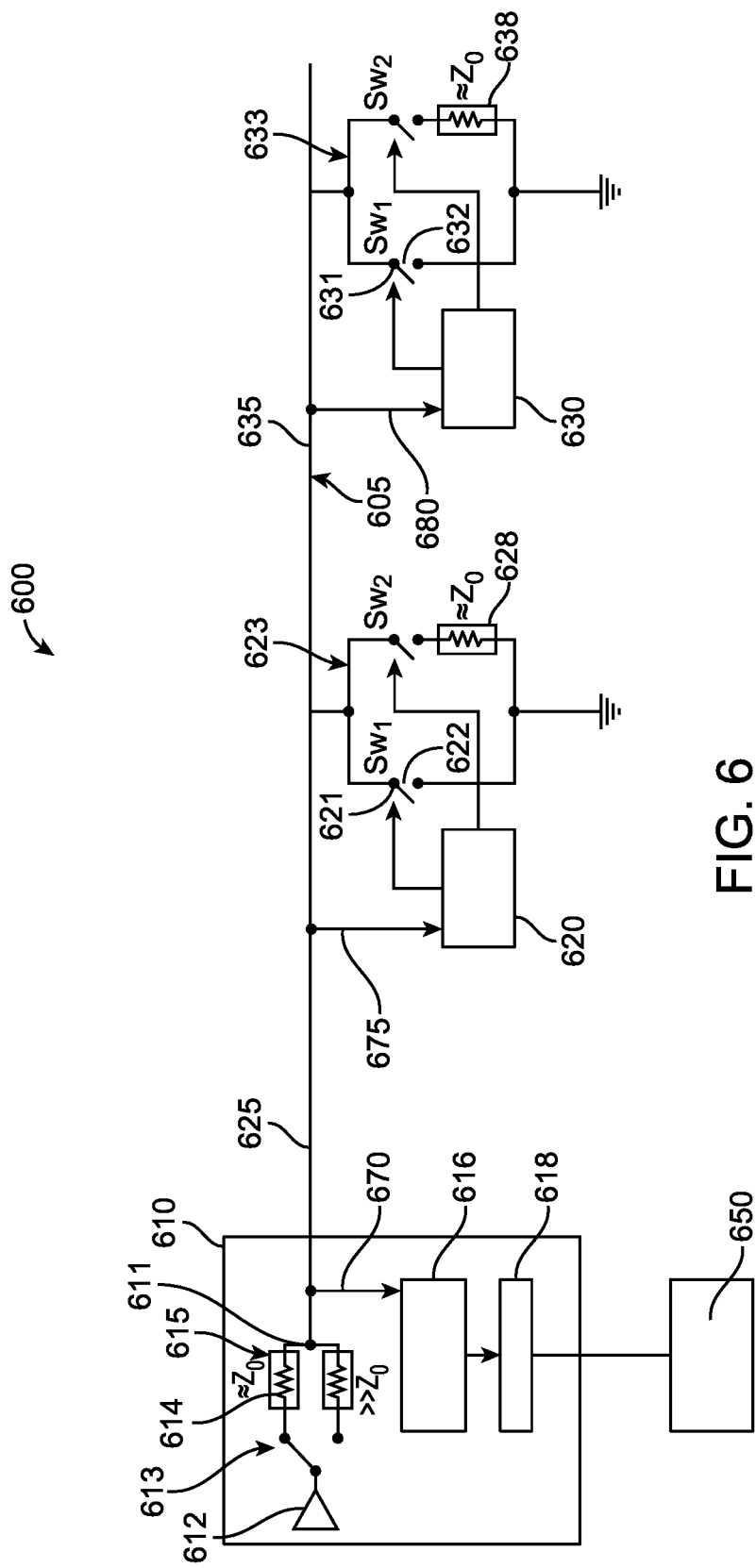
FIG. 6 is an illustration depicting an apparatus, according to an exemplary embodiment of the present disclosure.

FIG. 6 illustrates an apparatus and system in accordance with certain exemplary embodiments of the present disclosure. As depicted in FIG. 6, the apparatus 600 includes a first tool component 610 and a second tool component 620 spaced apart from the first tool component 610 and communicatively coupled by wire segment 625 of wire 605. The apparatus 600 further includes a third tool component 630 spaced apart from the first tool component 610 and the second tool component 620 and coupled with the first tool component 610 by wire segment 635 of wire 605. Wire 605 has a characteristic line impedance ($Z_0$).

Wire 605 includes a first termination point 611, a second termination point 621, and a third termination point 631. The first tool component 610 is coupled with the first termination point 611 of wire 605, while the second tool component 620 is coupled with the second termination point 621 of wire 605 and the third tool component 630 is coupled with the third termination point 631 of wire 605. The first termination point 611 has a source impedance ($Z_S$) 611 while the second termination 621 has a first load impedance ($Z_L$) 628 and the third termination 631 has a second load impedance ($Z_L$) 638.

The first tool component 610 includes a first impedance altering device 615 and the second tool component 620 includes a second impedance altering device 623. The impedance altering devices 615, 623 may be configured to alter, for a first predetermined period of time, the source impedance ($Z_S$) 611 and/or the load impedance ($Z_L$) 628 sufficient to generate a characteristic signal reflection upon the transmission of a signal along a length 625 of wire 605 between the first tool component 610 and the second tool component 620. In at least some instances, the impedance altering device 615 may comprise a source resistor 614 and switch 613, as shown in FIG. 6, which would be the simplest implementation. In other cases, the impedance altering device may be a capacitor, an inductor, an impedance-changing transformer, active circuitry (such as transistors, op-amps, switches, etc.), or any combination of these.

The first tool component 610 may be configured to transmit a clock signal along the length 625 of wire 605 between the first tool component 610 and the second tool component 620 during the first predetermined period of time. The first tool component 610 is also configured to receive one or more reflected clock signals reflected during the first predetermined period of time.

The third tool component 630 includes a third impedance altering device 633. The impedance altering devices 615, 633 may be further configured to alter, for a second predetermined period of time, the source impedance ($Z_S$) 611 and/or the load impedance ($Z_L$) 638 sufficient to generate a characteristic signal reflection upon the transmission of a signal along a length 635 of wire 605 between the first tool component 610 and the third tool component 630. The first tool component 610 may also be configured to transmit a clock signal along the length 635 of wire 605 between the first tool component 610 and the third tool component 630 during the second predetermined period of time. The first tool component 610 is also configured to receive one or more reflected clock signals reflected during the second predetermined period of time.

Apparatus 600 may further include a computing device 650 coupled with the first tool component 610. The computing device 650 may be configured to determine a propagation delay based on the one or more reflected clock signals according to the presently disclosed methods and techniques. The computing device 650 may be further configured to determine a wire integrity characteristic based on the one or more reflected clock signals. Apparatus 600 may also include communication lines 670, 675, 680 coupling tool components 610, 620, 630 to wire 605 so that signals and other communications may be transmitted between one or more controllers, such as computing device 650, and tool components 610, 620, 630. Communication lines 670, 675, 680 may be any high impedance lines that do not significantly impact the impedance of wire 605.

The impedance altering devices 615, 623, 633 may be configured to alter the source impedance ($Z_S$) and/or the load impedance ($Z_L$) at terminations of wire 605 according to any of the cases shown in FIG. 9, so long as the source impedance ($Z_S$) and/or the load impedance ($Z_L$) is altered sufficient to generate a characteristic signal reflection upon the transmission of a signal along a length of wire 605 between any one of the tool components.

In at least some instances, the impedance altering devices (one on each tool/component) may be configured to alter the source impedance and/or the load impedance so as to generate an impedance mismatch between the source impedance, the load impedance, and the characteristic line impedance ($Zo$) sufficient to generate a characteristic signal reflection upon the transmission of a signal along a length of wire between the first tool component and the second tool component. In some cases, the impedance altering devices may be configured to alter the source impedance and/or the load impedance so as to cause the source impedance to be greater than the line characteristic impedance (>>Zo) and the load impedance to be lower than the line characteristic impedance (<<Zo, i.e. a short), as in the case of the Step Induced Natural Ring (case 1). In other cases, the impedance altering devices may be configured to alter the source impedance and/or the load impedance so as to cause the source impedance to be substantially the same as the line characteristic impedance (~Zo) and the load impedance to be either greater than the line characteristic impedance (>>Zo), as in the cases of the Positive Step and Pulse Reflection (cases 2 and 4), or lower than the line characteristic impedance (<<Zo, i.e. a short), as in the case of the Negative Step Reflection (case 3).

During operation of apparatus 600 corresponding to the "Step Induced Natural Ring" (Case 1) shown in FIG. 9, the first tool component 610 is configured to initiate propagation delay measurements by transmitting a command signal to the second tool component 620. Upon receiving the command signal from the first tool component 610, the second tool component 620 is configured to generate a short (or low impedance) 622, for a first predetermined period of time, along a length of the wire between the first tool component 610 and the second tool component 620. The first tool component 610 is further configured to transmit a clock signal along the length of the wire between the first tool component 610 and the second tool component 620 during the first predetermined period of time. The clock signal may be, for example, a step function, pulse, or a square wave.

As depicted in FIG. 6, a line driver 612, included in the first tool component 610, transmits the clock signal through a source resistor 614 to the wire between the first tool component 610 and the second tool component 620. While a source resistor 614 is shown in FIG. 6, apparatus 600 may include any component or means capable of generating sufficient source impedance to carry out the presently disclosed method and technique. The source resistor 614 must be selected to have a high enough resistor value as compared to the characteristic impedance of the wire 605 so as to generate a significant impedance mismatch (>>Zo). Due to the generation of a short 622 along wire segment 625 between the first tool component 610 and the second tool component 620, the clock signal is reflected along the length of the wire. The first tool component 610 is configured to receive one or more of the reflected clock signals reflected during the first predetermined period of time. A computing device 650 coupled with the first tool component 610 is configured to determine a propagation delay based on the one or more reflected clock signals. The determined propagation delay corresponds to the time of propagation along a length of the wire segment 625 between the first tool component 610 and the short 622. For example, the propagation delay, $T_P$, from the line driver 612 to the short 622 at the end of wire segment 625 can be calculated as:

$$T_p = \frac{(T_b - T_a)}{2},\qquad \text{Eqn. 1}$$

where $(T_b-T_a)$ represents the round trip time delay between the line driver and the short and back to the source, or one half (½) the time period of one full waveform. Thus, the propagation delay can also be calculated as:

$$T_p = \frac{T}{4},\qquad \text{Eqn. 2}$$

where T is the time period of the ringing due to reflection. In order to increase the accuracy of the propagation delay measurement, the time period T can be determined by averaging multiple cycles. This can be achieved by the use of a zero crossing detector 616 and a digital counter 618 which may be included in the first tool component 610, as depicted in FIG. 6. The zero crossing detector 616, placed after the source resistor 614, converts the ringing due to impedance mismatch to a square wave. The digital counter 618 determines the frequency of the ringing providing for determination of the propagation delay.

In addition, the reflection coefficient, ρ, for wire segment 625 may be determined according to the following equation:

$$\rho = \frac{Z_{term} - Z_0}{Z_{term} + Z_0},\qquad \text{Eqn. 3}$$

where ρ is the reflection coefficient, $Z_{term}$ is the termination impedance at the end of the wire, and $Z_0$ is the characteristic impedance of the wire. For the short at the far end, the reflection coefficient will be −1, while the reflection coefficient will be approximately +1 for the high Z resistor or impedance altering device at the source.

During operation of apparatus 600 corresponding to the "Positive Step Reflection," "Negative Step Reflection," and "Positive Pulse Reflection" (Cases 2-4), shown in FIG. 9, feature 616 is a threshold detector and feature 618 is a counter/timer used to determine or measure the round trip time between the initial clock signal and the reflected clock signal. In such cases, the threshold detector 616 has an appropriate reference voltage for the reflected waveform.

Figure 7:
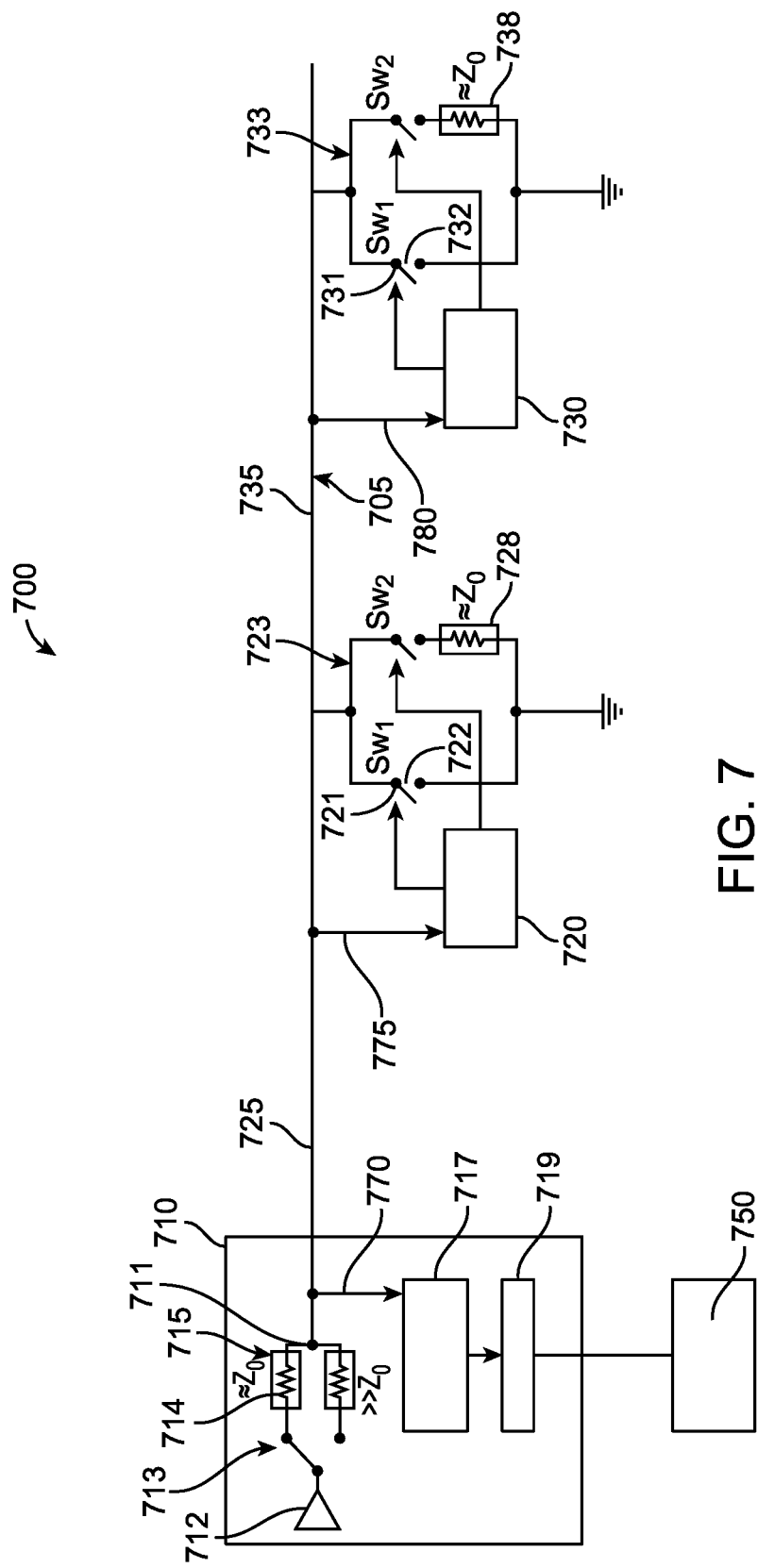
FIG. 7 is an illustration depicting an apparatus having an analog to digital converter (ADC) and a buffer/signal conditioner for the ADC, according to an exemplary embodiment of the present disclosure.

FIG. 7 illustrates an apparatus and system in accordance with certain exemplary embodiments of the present disclosure. The apparatus 700 shown in FIG. 7 is applicable to all Cases 1-4, shown in FIG. 9. As depicted in FIG. 7, the apparatus 700 includes a first tool component 710 and a second tool component 720 spaced apart from the first tool component 710 and communicatively coupled by wire segment 725 of wire 705. The apparatus 700 further includes a third tool component 730 spaced apart from the first tool component 710 and the second tool component 720 and coupled with the first tool component 710 by wire segment 735 of wire 705. Wire 705 has a characteristic line impedance ($Z_0$). Line driver 712 is capable of transmitting a signal along the wire 705 between the first tool component 710 and the second tool component 720.

Wire 705 includes a first termination point 711, a second termination point 721, and a third termination point 731. The first tool component 710 is coupled with the first termination point 711 of wire 705, while the second tool component 720 is coupled with the second termination point 721 of wire 705 and the third tool component 730 is coupled with the third termination point 731 of wire 705. The first termination point 711 has a source impedance ($Z_S$) 711 while the second termination 721 has a first load impedance ($Z_L$) 728 and the third termination 731 has a second load impedance ($Z_L$) 738.

The first tool component 710 includes a first impedance altering device 715 and the second tool component 720 includes a second impedance altering device 723. The impedance altering devices 715, 723 may be configured to alter, for a first predetermined period of time, the source impedance ($Z_S$) 711 and/or the load impedance ($Z_L$) 728 sufficient to generate a characteristic signal reflection upon the transmission of a signal along a length 725 of wire 705 between the first tool component 710 and the second tool component 720. In at least some instances, the impedance altering device 715 may comprise a source resistor 714 and switch 713, as shown in FIG. 7, which would be the simplest implementation. In other cases, the impedance altering device may be a capacitor, an inductor, an impedance-changing transformer, active circuitry (such as transistors, op-amps, switches, etc.), or any combination of these.

The first tool component 710 may be configured to transmit a clock signal along the length 725 of wire 705 between the first tool component 710 and the second tool component 720 during the first predetermined period of time. The first tool component 710 is also configured to receive one or more reflected clock signals reflected during the first predetermined period of time.

The third tool component 730 includes a third impedance altering device 733. The impedance altering devices 715, 733 may be further configured to alter, for a second predetermined period of time, the source impedance ($Z_S$) 711 and/or the load impedance ($Z_L$) 738 sufficient to generate a characteristic signal reflection upon the transmission of a signal along a length 735 of wire 705 between the first tool component 710 and the third tool component 730. The first tool component 710 may also be configured to transmit a clock signal along the length 735 of wire 705 between the first tool component 710 and the third tool component 730 during the second predetermined period of time. The first tool component 710 is also configured to receive one or more reflected clock signals reflected during the second predetermined period of time.

Apparatus 700 may further include a computing device 750 coupled with the first tool component 710. The computing device 750 may be configured to determine a propagation delay based on the one or more reflected clock signals according to the presently disclosed methods and techniques. The computing device 750 may be further configured to determine a wire integrity characteristic based on the one or more reflected clock signals. Apparatus 700 may also include communication lines 770, 775, 780 coupling tool components 710, 720, 730 to wire 705 so that signals and other communications may be transmitted between one or more controllers, such as computing device 750, and tool components 710, 720, 730. Communication lines 770, 775, 780 may be any high impedance lines that do not significantly impact the impedance of wire 705.

The impedance altering devices 715, 723, 733 may be configured to alter the source impedance ($Z_S$) and/or the load impedance ($Z_L$) at terminations of wire 705 according to any of the cases shown in FIG. 9, so long as the source impedance ($Z_S$) and/or the load impedance ($Z_L$) is altered sufficient to generate a characteristic signal reflection upon the transmission of a signal along a length of wire 705 between any one of the tool components.

Unlike apparatus 600 depicted in FIG. 6, apparatus 700 includes an analog to digital converter (ADC) 719 that is sampled very fast compared to the round trip time. Apparatus 700 further includes a buffer/signal conditioner 717 for the ADC 719. The buffer/signal conditioner 717 may include amplification and/or filtering. Computing device 750 may be configured to determine the frequency of the converted reflected clock signal (for Case 1 in FIG. 9) or the round trip time between the initial clock signal and the reflected clock signal (for Cases 2-4 in FIG. 9), using the captured waveform. Therefore, apparatus 700 may be operated according to Cases 1-4 shown in FIG. 9.

Figure 8:
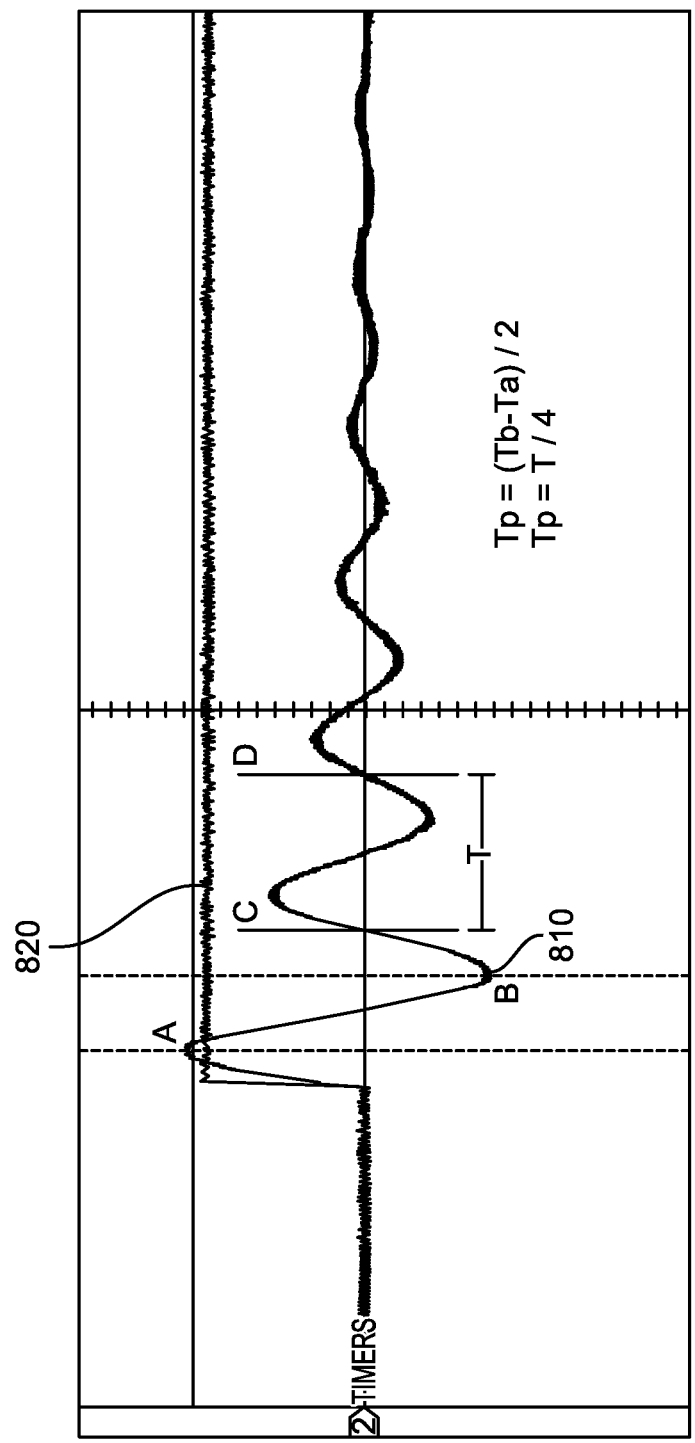
FIG. 8 is an illustration depicting signal reflection due to a 10K resistor placed in series to the line driver on a shorted wire, according to an exemplary embodiment of the present disclosure.

FIG. 8 illustrates signal reflection due to a 10K resistor placed in series to the line driver on a shorted wire, according to an exemplary embodiment of the present disclosure. As depicted in FIG. 8, a clock signal is reflected 810 due to a 10K resistor placed in series to the line driver while the end of a 51 foot line was shorted to the ground. The reflected signal travels the length of the wire and returns at point "B" in FIG. 8. The direct output of the line driver 820 is also shown in FIG. 8.

The above described method for determining the propagation delay may be repeated, in turn, for each of wires coupling each of the tool components included in the apparatus 600, shown in FIG. 6, until the propagation delay is measured for each wire segment of interest in the apparatus 600. For example, a propagation delay measurement for wire segment 635, coupling the first tool component 610 with the third tool component 630, may be initiated by first tool component 610 transmitting a command signal to the third tool component 630. Upon receiving the command signal from the first tool component 610, the third tool component 630 generates a short 632, for a second predetermined period of time, along a length of the wire 635 between the first tool component 610 and the third tool component 630. The first tool component 610 then transmits a clock signal along the length of the wire 635 between the first tool component 610 and the third tool component 630, during the second predetermined period of time. The first tool component 610 receives one or more of the reflected clock signals reflected during the second predetermined period of time. Computing device 650 may then determine a propagation delay corresponding to the time of propagation along the length of wire 635 between the first tool component 610 and the short 632, based on the one or more reflected clock signals reflected during the second predetermined time period.

The method for determining a propagation delay for a downhole wire, described above, may be repeated, in turn, for each wire of interest included in apparatus 600. Propagation delay measurements may be initiated either periodically or when the system temperature changes in order to correct the operational parameters of the tool for propagation delay between different tool components.

The first tool component 610 may be further configured to transmit a clock synchronization signal to the second tool component 620 based on the propagation delay measurement. The computing device 650 may be configured to correct one or more tool measurements based on the determined propagation delay.

In at least some instances, apparatus 600 may be a resistivity logging tool or otherwise apparatus 600 may be included in a resistivity logging tool. In such cases, the first tool component 610 may be the transmitter of a resistivity logging tool. The second tool component 620 and the third tool component 630 may be receivers of the resistivity logging tool. The wire 605, coupling the transmitter to the receivers spaced apart from the transmitter, may be the bus of a resistivity logging tool.

In at least some instances, the transmitter and the receiver of the resistivity tool, corresponding to the first tool component 610 and the second tool component 620 in FIG. 6, respectively, may be spaced apart by at least 25 feet. In other cases, the first tool component 610 and the second tool component 620 may be spaced apart by at least 75 feet. In some cases, the first tool component 610 and the second tool component 620, or the transmitter and the receiver of the resistivity tool, may be spaced apart by between about 25 feet and about 125 feet. In other cases, the first tool component 610 and the second tool component 620, or the transmitter and the receiver of the resistivity tool, may be spaced apart by between about 75 feet and about 125 feet. In still other cases, the first tool component 610 and the second tool component 620, or the transmitter and the receiver of the resistivity tool, may be spaced apart by between about 100 feet and about 125 feet.

In cases in which the first tool component 610 and the second tool component 620 are spaced apart by at least 25 feet, the propagation delay in the wire that carries the clock synchronization signal between different tool components, such as the transmitters and receivers, will introduce a significant phase offset error. The phase offset error will depend upon the distance between the transmitter and the corresponding receiver, the type of bus wire, parasitic effects, and changes in temperature. At least some resistivity logging tools require precise clock synchronization, e.g., down to tens of nanoseconds, to achieve accuracy in phase and amplitude measurements across different tool components. The presently disclosed apparatus, method, and system can correct the phase error due to propagation delay in real time and during downhole operation. For example, transmitter may transmit a clock synchronization signal to each of the receivers based on the determined propagation delay. Additionally, the computing device 650 may be configured to correct or adjust one or more resistivity measurements based on the propagation delays measured between different tool components. The computing device 650 may also be configured to determine a phase correction of a resistivity measurement, based on the measured propagation delays. The present disclosure also provides for automated calibration of multiple receivers placed in the BHA.

The apparatus 600 may also be used to monitor the integrity of downhole wires, including those wires connecting different components of a downhole tool. For example, computing device 650 may be configured to determine a wire integrity characteristic based on the one or more reflected clock signals. In some cases, computing device 650 may be configured to determine wire integrity characteristics for each of the downhole wires coupling the tool components of a downhole tool. The wire integrity characteristic may include a change in propagation delay, a change in the reflected signal amplitude or frequency, a change in the decay of the reflected signal, and a change in the reflection coefficient. In the case that a resistivity logging tool comprises apparatus 600, the wire integrity characteristic may correspond to the bus integrity of a resistivity tool. The wire integrity characteristic determination may be used to adjust at least one operational parameter. For example, the operational parameter may be a drilling parameter, a logging parameter, a completion parameter, a production parameter, and any combination thereof. A resistivity logging tool operational parameter may also be altered or adjusted based on the wire integrity characteristic.

The presently disclosed apparatus, method, and system for monitoring wire integrity may be used to provide diagnostics for determining bus or transmission line integrity and fault location. For example, the presently disclosed method can be applied to legacy tools to determine bus or sub-bus integrity and fault location, thus enabling quick identification of, for example, faulty collars or tool joints. Changes in signal reflection and signal decay can indicate potential wire connection issues, such as failing downhole connectors and can serve as a means of early wire failure detection.

In at least some instances, the first tool component 610 and the second tool component 620 may both be located downhole as components of a downhole tool. In other cases, the first tool component 610 may be located at the surface and the second tool component 620 may be located downhole.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one or a set indicates that a system including either one member of" the set, or multiple members of the set, or all members of the set, satisfies the claim.

Statements of the Disclosure Include

Statement 1: An apparatus comprising: a first tool component and a second tool component spaced apart from the first tool component; a wire communicatively coupling the first tool component and the second tool component; wherein the first tool component is configured to transmit a command signal to the second tool component and the second tool component is configured to, upon receiving the command signal, generate a short (or low impedance <<Zo) for a first predetermined period of time along a length of the wire between the first tool component and the second tool component; wherein the first tool component is further configured to transmit a clock signal along the length of wire between the first tool component and the second tool component during the first predetermined period of time; and wherein the first tool component is configured to receive one or more reflected clock signals reflected during the first predetermined period of time.

Statement 2: An apparatus according to Statement 1, further comprising a computing device coupled with the first tool component, the computing device configured to determine a propagation delay based on the one or more reflected clock signals, wherein the propagation delay corresponds to the time of propagation along a length of the wire between the first tool component and the short (or low impedance <<Zo).

Statement 3: An apparatus according to Statement 1 or Statement 2, wherein the propagation delay is determined according to the equation:

$$T_P = \frac{(T_B - T_A)}{2}$$

where $T_P$ is the propagation delay and $T_B - T_A$ is the round trip time of propagation along the wire between the first tool component and the short (or low impedance <<Zo) and back to the first tool component.

Statement 4: An apparatus according to any one of the preceding Statements 1-3, wherein the computing device is further configured to determine a wire integrity characteristic based on the one or more reflected clock signals.

Statement 5: An apparatus according to any one of the preceding Statements 1-4, further comprising a third tool component spaced apart from the first and second tool components, the wire communicatively coupling the third tool component with the first tool component; wherein the first tool component is configured to transmit a command signal to the third tool component, the third tool component configured to, upon receiving the command signal, generate a short (or low impedance, <<Zo), for a second predetermined period of time, along a length of the wire between the first tool component and the third tool component; wherein the first tool component is further configured to transmit a clock signal along the length of wire between the first tool component and the third tool component during the second predetermined period of time; and wherein the first tool component is configured to receive one or more reflected clock signals reflected during the second predetermined period of time.

Statement 6: An apparatus according to Statement 5, further comprising a computing device coupled with the first tool component, the computing device configured to determine: a first propagation delay based on the one or more reflected clock signals reflected during the first predetermined period of time; and a second propagation delay based on the one or more reflected clock signals reflected during the second predetermined period of time.

Statement 7: An apparatus according to Statement 6, wherein the computing device is further configured to determine: a first wire integrity characteristic based on the one or more reflected clock signals reflected during the first predetermined period of time; and a second wire integrity characteristic based on the one or more reflected clock signals reflected during the second predetermined period of time.

Statement 8: An apparatus according to any one of the preceding Statements 1-7, wherein the clock signal is a step function or pulse.

Statement 9: An apparatus according to any one of the preceding Statements 1-8, wherein the clock signal is a square wave.

Statement 10: An apparatus according to any one of the preceding Statements 1-9, wherein the first tool component comprises a line driver and a source resistor o impedance altering device, the line driver configured to transmit the clock signal through the source resistor or impedance altering device.

Statement 11: An apparatus according to any one of the preceding Statements 1-10, wherein the first tool component further comprises a zero crossing detector or threshold detector located between the source resistor or impedance altering device and the second tool component; the zero crossing detector or threshold detector configured to convert the reflected clock signal to a square wave or clean edge/pulse.

Statement 12: An apparatus according to any one of the preceding Statements 1-11, wherein the first tool component further comprises a counter configured to determine the frequency of the converted reflected clock signal or measure the round trip time between the initial clock signal and the reflected clock signal.

Statement 13: An apparatus according to any one of the preceding Statements 1-12, wherein the first tool component is a transmitter and the second tool component is a receiver of a resistivity logging tool.

Statement 14: An apparatus according to any one of the preceding Statements 1-13, wherein the wire between the first tool component and the second tool component comprises a length of at least 25 feet.

Statement 15: An apparatus according to any one of the preceding Statements 1-14, wherein the length of wire between the first tool component and the second tool component is between about 25 feet and about 125 feet.

Statement 16: An apparatus according to any one of the preceding Statements 1-15, wherein the first tool component is located on a surface adjacent a wellbore and the second tool component is located downhole.

Statement 17: An apparatus according to Statement 1, further comprising at least one processor coupled with a non-transitory computer-readable storage medium having stored therein instructions which, when executed by the at least one processor, causes the at least one processor to determine a propagation delay based on the one or more reflected clock signals, wherein the propagation delay corresponds to the time of propagation along a length of the wire between the first tool component and the short (or low impedance <<Zo).

Statement 18: An apparatus according to Statement 17, wherein the propagation delay is determined according to the equation:

$$T_P = \frac{(T_B - T_A)}{2}$$

where $T_P$ is the propagation delay and $T_B - T_A$ is the round trip time of propagation along the wire between the first tool component and the short (or low impedance <<Zo) and back to the first tool component.

Statement 19: An apparatus according to Statement 1, Statement 17, or Statement 18, further comprising at least one processor coupled with a non-transitory computer-readable storage medium having stored therein instructions which, when executed by the at least one processor, causes the at least one processor to determine a wire integrity characteristic based on the one or more reflected clock signals.

Statement 20: An apparatus according to Statement 19, further comprising a third tool component spaced apart from the first and second tool components, the wire communicatively coupling the third tool component with the first tool component; wherein the first tool component is configured to transmit a command signal to the third tool component, the third tool component configured to, upon receiving the command signal, generate a short (or low impedance, <<Zo), for a second predetermined period of time, along a length of the wire between the first tool component and the third tool component; wherein the first tool component is further configured to transmit a clock signal along the length of wire between the first tool component and the third tool component during the second predetermined period of time; and wherein the first tool component is configured to receive one or more reflected clock signals reflected during the second predetermined period of time.

Statement 21: An apparatus according to Statement 20, further comprising at least one processor coupled with a non-transitory computer-readable storage medium having stored therein instructions which, when executed by the at least one processor, causes the at least one processor to determine: a first propagation delay based on the one or more reflected clock signals reflected during the first predetermined period of time; and a second propagation delay based on the one or more reflected clock signals reflected during the second predetermined period of time.

Statement 22: An apparatus according to Statement 20 or Statement 21, further comprising at least one processor coupled with a non-transitory computer-readable storage medium having stored therein instructions which, when executed by the at least one processor, causes the at least one processor to determine: a first wire integrity characteristic based on the one or more reflected clock signals reflected during the first predetermined period of time; and a second wire integrity characteristic based on the one or more reflected clock signals reflected during the second predetermined period of time.

Statement 23: An apparatus according to any one of the preceding Statements 17-22, wherein the clock signal is a step function or pulse.

Statement 24: An apparatus according to any one of the preceding Statements 17-23, wherein the clock signal is a square wave.

Statement 25: An apparatus according to any one of the preceding Statements 17-24, wherein the first tool component comprises a line driver and a source resistor or impedance altering device, the line driver configured to transmit the clock signal through the source resistor or impedance altering device.

Statement 26: An apparatus according to any one of the preceding Statements 17-25, wherein the first tool component further comprises a zero crossing detector or threshold detector located between the source resistor or impedance altering device and the second tool component; the zero crossing detector or threshold detector configured to convert the reflected clock signal to a square wave or clean edge/pulse.

Statement 27: An apparatus according to any one of the preceding Statements 17-26, wherein the first tool component further comprises a counter configured to determine the frequency of the converted reflected clock signal or measure the round trip time between the initial clock signal and the reflected clock signal.

Statement 28: An apparatus according to any one of the preceding Statements 17-27, wherein the first tool component is a transmitter and the second tool component is a receiver of a resistivity logging tool.

Statement 29: An apparatus according to any one of the preceding Statements 17-28, wherein the wire between the first tool component and the second tool component comprises a length of at least 25 feet.

Statement 30: An apparatus according to any one of the preceding Statements 17-29, wherein the length of wire between the first tool component and the second tool component is between about 25 feet and about 125 feet.

Statement 31: An apparatus according to any one of the preceding Statements 17-29, wherein the first tool component is located on a surface adjacent a wellbore and the second tool component is located downhole.

Statement 32: A method of determining the propagation delay for a downhole wire, the method comprising: transmitting, at a first tool component, a command signal along a downhole wire to a second tool component; receiving, at the second tool component, the command signal; generating, in response to the command signal, a short (or low impedance, <<Zo) along a length of the wire between the first tool component and the second tool component for a first predetermined period of time; transmitting, at the first tool component, during the first predetermined period of time, a clock signal along the length of the wire between the first tool component and the second tool component; receiving, at the first tool component, one or more reflected clock signals reflected during the first predetermined period of time; and determining, at a processor, a propagation delay based on the one or more reflected clock signals reflected during the first predetermined period of time.

Statement 33: A method of determining the propagation delay for a downhole wire according to Statement 32, further comprising transmitting, at the first tool component, a clock synchronization signal to the second tool component, based on the determined propagation delay.

Statement 34: A method of determining the propagation delay for a downhole wire according to Statement 32 or Statement 33, further comprising correcting, at a processor, one or more tool measurements based on the determined propagation delay.

Statement 35: A method of determining the propagation delay for a downhole wire according to any one of the preceding Statements 32-34, further comprising: transmitting, at the first tool component, a command signal along a downhole wire to a third tool component; receiving, at the third tool component, the command signal; generating, in response to the command signal, a short (or low impedance, <<Zo) along a length of the wire between the first tool component and the third tool component for a second predetermined period of time; transmitting, at the first tool component, during the second predetermined period of time, a clock signal along the length of the wire between the first tool component and the third tool component; receiving, at the first tool component, one or more reflected clock signals reflected during the second predetermined period of time; and determining, at a processor, a propagation delay based on the one or more reflected clock signals reflected during the second predetermined period of time.

Statement 36: A method of determining the propagation delay for a downhole wire according to any one of the preceding Statements 32-35, wherein the clock signal is a step function or pulse.

Statement 37: A method of determining the propagation delay for a downhole wire according to any one of the preceding Statements 32-36, wherein the clock signal is a square wave.

Statement 38: A method of determining the propagation delay for a downhole wire according to any one of the preceding Statements 32-37, wherein the first tool component comprises a line driver and a source resistor or impedance altering device, the method further comprising transmitting, at the line driver, a clock signal through the source resistor or impedance altering device along the length of the wire between the first tool component and the second tool component, during the first predetermined period of time.

Statement 39: A method of determining the propagation delay for a downhole wire according to any one of the preceding Statements 32-38, wherein the first tool component further comprises a zero crossing detector or threshold detector located between the source resistor or impedance altering device and the second tool component, the method further comprising converting, at the zero crossing detector or threshold detector, the reflected clock signal to a square wave or clean edge/pulse.

Statement 40: A method of determining the propagation delay for a downhole wire according to any one of the preceding Statements 32-39, wherein the first tool component further comprises a counter, the method further comprising determining, at the counter, the frequency of the converted reflected clock signal or measure the round trip time between the initial clock signal and the reflected clock signal.

Statement 41: A method of determining the propagation delay for a downhole wire according to any one of the preceding Statements 32-40, wherein the first tool component is a transmitter and the second tool component is a receiver of a downhole resistivity tool, the method further comprising making a resistivity measurement with the resistivity tool.

Statement 42: A method of determining the propagation delay for a downhole wire according to any one of the Statement 41, further comprising adjusting, at a processor, the resistivity measurement based on the propagation delay.

Statement 43: A method of determining the propagation delay for a downhole wire according to Statement 41, further comprising determining, at a processor, a phase correction of the resistivity or receiver/transmitter measurement based on the propagation delay.

Statement 44: A method of determining the propagation delay for a downhole wire according to any one of the preceding Statements 32-43, wherein the wire between the first tool component and the second tool component comprises a length of at least 25 feet.

Statement 45: A method of determining the propagation delay for a downhole wire according to any one of the preceding Statements 32-44, wherein the length of the wire between the first tool component and the second tool component is between about 25 feet and about 125 feet.

Statement 46: A method of determining the propagation delay for a downhole wire according to any one of the preceding Statements 32-44, wherein the first tool component is located on the surface adjacent a wellbore and the second tool component is located downhole.

Statement 47: A method of determining the propagation delay for a downhole wire according to any one of the preceding Statements 32-46, wherein the propagation delay is determined according to the equation:

$$T_P = \frac{(T_B - T_A)}{2}$$

where $T_P$ is the propagation delay and $T_B-T_A$ is the round trip time of propagation along the wire between the first tool component and the short and back to the first tool component.

Statement 48: A method of monitoring the integrity of a downhole wire, the method comprising: transmitting, at a first tool component, a command signal along a downhole wire to a second tool component; receiving, at the second tool component, the command signal; generating, in response to the command signal, a short (or low impedance, <<Zo) along a length of the wire between the first tool component and the second tool component for a first predetermined period of time; transmitting, at the first tool component, during the first predetermined period of time, a clock signal along the length of the wire between the first tool component and the second tool component; receiving, at the first tool component, one or more reflected clock signals reflected during the first predetermined period of time; and determining, at a processor, a wire integrity characteristic based on the one or more reflected clock signals reflected during the first predetermined period of time.

Statement 49: A method of monitoring the integrity of a downhole wire according to Statement 48, wherein the wire integrity characteristic is selected from the group consisting of a change in propagation delay, a change in the reflected signal amplitude or frequency, a change in the decay of the reflected signal, and a change in the reflection coefficient.

Statement 50: A method of monitoring the integrity of a downhole wire according to Statement 48 or Statement 49, further comprising modifying an operational parameter in based on the wire integrity characteristic determination.

Statement 51: A system wherein the first and second tool components of the apparatus according to statements 1 to 31 are disposed in a wellbore.

Statement 52: An apparatus comprising: a first tool component and a second tool component spaced apart from the first tool component; a wire having a first termination point and a second termination point, the wire communicatively coupling the first tool component and the second tool component and having a characteristic line impedance; wherein the first tool component is coupled with a first termination point of the wire and the second tool component is coupled with a second termination point of the wire, the first termination point of the wire having a source impedance and the second termination point of the wire having a load impedance; wherein the first tool component comprises a first impedance altering device and the second tool component comprises a second impedance altering device, the first and second impedance altering devices configured to alter, for a first predetermined period of time, at least one of the source impedance and the load impedance sufficient to generate a characteristic signal reflection upon the transmission of a signal along a length of wire between the first tool component and the second tool component; wherein the first tool component is configured to transmit a clock signal along the length of wire between the first tool component and the second tool component during the first predetermined period of time; and wherein the first tool component is configured to receive one or more reflected clock signals reflected during the first predetermined period of time.

Statement 53: An apparatus according to Statement 52, further comprising a computing device coupled with the first tool component, the computing device configured to determine a propagation delay based on the one or more reflected clock signals, wherein the propagation delay corresponds to the time of propagation along a length of the wire between the first termination point and the second termination point.

Statement 54: An apparatus according to Statement 52 or Statement 53, wherein the computing device is further configured to determine a wire integrity characteristic based on the one or more reflected clock signals.

Statement 55: An apparatus according to any one of the preceding Statements 52-54, wherein the impedance altering devices are configured to generate, for a first predetermined period of time, an impedance mismatch between the source impedance, the load impedance, and characteristic line impedance (Zo) sufficient to generate a characteristic signal reflection upon the transmission of a signal along a length of wire between the first tool component and the second tool component.

Statement 56: An apparatus according to any one of the preceding Statements 52-54, wherein the impedance altering devices are configured to generate a source impedance sufficient to generate a characteristic signal reflection upon the transmission of a signal along a length of wire between the first tool component and the second tool component.

Statement 57: An apparatus according to any one of the preceding Statements 52-54, wherein the impedance altering devices are configured to alter the load impedance by transmitting a command signal to the second tool component causing the second tool component to, upon receiving the command signal, generate a short for a first predetermined period of time along a length of the wire between the first tool component and the second tool component, wherein the short results in a smaller impedance than the characteristic line impedance (<<Zo), along the length of wire between the first tool component and the second tool component.

Statement 58: An apparatus according to any one of the preceding Statements 52-54, wherein the impedance altering devices are configured to alter, for a first predetermined period of time, at least one of the source impedance and the load impedance such that the source impedance is greater than the characteristic line impedance (>>Zo) and the load impedance is less than the characteristic line impedance (<<Zo).

Statement 59: An apparatus according to any one of the preceding Statements 52-54, wherein the impedance altering devices are configured to alter, for a first predetermined period of time, at least one of the source impedance and the load impedance such that the source impedance is substantially the same as the characteristic line impedance (~Zo) and the load impedance is either greater than the source characteristic line impedance (>>Zo) or less than the characteristic line impedance (<<Zo).

Statement 60: An apparatus according to any one of the preceding Statements 52-59, further comprising a third tool component spaced apart from the first and second tool components, the wire communicatively coupling the third tool component with the first tool component; wherein the wire has a third termination point coupled with the third tool component, the third impedance point having a second load impedance; wherein third tool component comprises a third impedance altering device, the third impedance altering device configured to alter, for a second predetermined period of time, at least one of the source impedance and the second load impedance sufficient to generate a characteristic signal reflection upon the transmission of a signal along a length of wire between the first tool component and the third tool component; wherein the first tool component is configured to transmit a clock signal along the length of wire between the first tool component and the third tool component during the second predetermined period of time; and wherein the first tool component is configured to receive one or more reflected clock signals reflected during the second predetermined period of time.

Statement 61: An apparatus according to any one of the preceding Statements 52-60, further comprising a computing device coupled with the first tool component, the computing device configured to determine: a first propagation delay based on the one or more reflected clock signals reflected during the first predetermined period of time; and a second propagation delay based on the one or more reflected clock signals reflected during the second predetermined period of time.

Statement 62: An apparatus according to any one of the preceding Statements 52-61, wherein the computing device is further configured to determine: a first wire integrity characteristic based on the one or more reflected clock signals reflected during the first predetermined period of time; and a second wire integrity characteristic based on the one or more reflected clock signals reflected during the second predetermined period of time.

Statement 63: An apparatus according to any one of the preceding Statements 52-62, wherein the first tool component comprises a line driver and the first impedance altering device comprises a source resistor, the line driver configured to transmit the clock signal through the source resistor.

Statement 64: An apparatus according to Statement 63, wherein the first tool component further comprises a zero crossing detector located between the source resistor and the second tool component and a counter, the zero crossing detector or threshold detector configured to convert the reflected clock signal to a square wave or clean edge/pulse, and the counter configured to determine the frequency of the converted reflected clock signal or measure the round trip time between the initial clock signal and the reflected clock signal.

Statement 65: An apparatus according to any one of the preceding Statements 52-64, wherein the first tool component is a transmitter and the second tool component is a receiver of a resistivity logging tool.

Statement 66: An apparatus according to any one of the preceding Statements 52-65, wherein the wire between the first tool component and the second tool component comprises a length of at least 25 feet.

Statement 67: A method of determining the propagation delay for a downhole wire, the method comprising: altering, for a first predetermined period of time, at least one of a source impedance of a first end of the wire and a load impedance of a second end of the wire, said altering sufficient to generate a characteristic signal reflection upon the transmission of a signal along a length of wire between the first tool component and the second tool component; transmitting, at the first tool component, during the first predetermined period of time, a clock signal along the length of the wire between the first tool component and the second tool component; receiving, at the first tool component, one or more reflected clock signals reflected during the first predetermined period of time; and determining, at a processor, a propagation delay based on the one or more reflected clock signals reflected during the first predetermined period of time.

Statement 68: A method according to Statement 67, further comprising transmitting, at the first tool component, a clock synchronization signal to the second tool component, based on the determined propagation delay.

Statement 69: A method according to Statement 67 or Statement 68, further comprising correcting, at a processor, one or more tool measurements based on the determined propagation delay.

Statement 70: A method according to any one of the preceding Statements 67-69, wherein the first tool component is a transmitter and the second tool component is a receiver of a downhole resistivity tool, the method further comprising making a resistivity measurement with the resistivity tool.

Statement 71: A method according to any one of the preceding Statements 67-80, further comprising determining, at a processor, a phase correction of the resistivity or transmitter/receiver measurement based on the propagation delay.

Statement 72: A method of monitoring the integrity of a downhole wire, the method comprising: altering, for a first predetermined period of time, at least one of a source impedance of a first end of the wire and a load impedance of a second end of the wire, said altering sufficient to generate a characteristic signal reflection upon the transmission of a signal along a length of wire between the first tool component and the second tool component; transmitting, at the first tool component, during the first predetermined period of time, a clock signal along the length of the wire between the first tool component and the second tool component; receiving, at the first tool component, one or more reflected clock signals reflected during the first predetermined period of time; and determining, at a processor, a wire integrity characteristic based on the one or more reflected clock signals reflected during the first predetermined period of time.

Statement 73: A method according to Statement 72, wherein the wire integrity characteristic is selected from the group consisting of a change in propagation delay, a change in the reflected signal amplitude or frequency, a change in the decay of the reflected signal, and a change in the reflection coefficient.

Statement 74: A method according to Statement 72 or Statement 73, further comprising modifying an operational parameter based upon the wire integrity characteristic determination.

Statement 75: A method according to any one of the preceding Statements 72-74, wherein the wire integrity characteristic corresponds to the bus integrity of a resistivity tool, the method further comprising altering a resistivity logging tool operational parameter based on the wire integrity characteristic determination.

Statement 76: A system comprising: a first tool component, a second tool component, and third tool component disposed within a wellbore, each tool component spaced apart from the other; a wire communicatively coupling the first tool component, the second tool component, and the third tool component; wherein the first tool component is coupled with a first termination point of the wire, the second tool component is coupled with a second termination point of the wire, and the third tool component is coupled with a third termination point of the wire, the first termination point having a source impedance, the second termination point having a first load impedance, and the third termination point having a second load impedance; wherein the first tool component comprises a first impedance altering device and the second tool component comprises a second impedance altering device, the a first and second impedance altering device coupled with the wire; and a computing device coupled with the first tool component; wherein impedance altering devices are configured to alter, for a first predetermined period of time, at least one of the source impedance and the first load impedance sufficient to generate a characteristic signal reflection upon the transmission of a signal along a length of wire between the first tool component and the second tool component; the impedance altering devices are further configured to alter, for a second period of time, at least one of the source impedance and the second load impedance sufficient to generate a characteristic signal reflection upon the transmission of a signal along a length of wire between the first tool component and the third tool component; wherein the first tool component is configured to transmit a clock signal along the length of wire between the first tool component and the second tool component during the first predetermined period of time and configured to transmit a clock signal along the length of wire between the first tool component and the third tool component during the second predetermined period of time; and wherein the first tool component is configured to receive one or more reflected clock signals reflected during the first and second predetermined periods of time; and wherein the computing device is configured to determine a: a first propagation delay or a first wire integrity characteristic based on the one or more reflected clock signals reflected during the first predetermined period of time; and a second propagation delay or a second wire integrity characteristic based on the one or more reflected clock signals reflected during the second predetermined period of time.

We claim:

1. An apparatus comprising:
   a first tool component,
   a second tool component spaced apart from the first tool component;
   a wire having a first termination point and a second termination point, the wire communicatively coupling the first tool component and the second tool component and having a characteristic line impedance, wherein:
      the first tool component is coupled to a first termination point of the wire and the second tool component is coupled to a second termination point of the wire, the first termination point of the wire having a source impedance and the second termination point of the wire having a load impedance,
      the first tool component includes a first impedance altering device and the second tool component includes a second impedance altering device, the first and second impedance altering devices configured to alter, for a first predetermined period of time, at least one of the source impedance and the load impedance sufficient to generate a characteristic signal reflection upon transmission of a signal along a length of wire between the first tool component and the second tool component,
      the first tool component is configured to transmit a clock signal along the length of wire between the first tool component and the second tool component during the first predetermined period of time, and
      wherein the first tool component is configured to receive one or more reflected clock signals reflected during the first predetermined period of time; and
   a computing device coupled to the first tool component that identifies a propagation delay associated with the one or more reflected clock signals, wherein a measurement associated with at least one of the first tool component or the second tool component is corrected based on the identified propagation delay.

2. The apparatus according to claim 1, wherein the propagation delay corresponds to the time of propagation along a length of the wire between the first termination point and the second termination point.

3. The apparatus according to claim 2, wherein the computing device is further configured to determine a wire integrity characteristic based on the one or more reflected clock signals.

4. The apparatus according to claim 2, wherein the impedance altering devices are configured to generate, for a first predetermined period of time, an impedance mismatch between the source impedance, the load impedance, and characteristic line impedance (Zo) sufficient to generate the characteristic signal reflection upon the transmission of the signal along the length of wire between the first tool component and the second tool component.

5. The apparatus according to claim 2, wherein the impedance altering devices are configured to generate a source impedance sufficient to generate the characteristic signal reflection upon the transmission of the signal along a length of wire between the first tool component and the second tool component.

6. The apparatus according to claim 2, wherein the impedance altering devices are configured to alter the load impedance by transmitting a command signal to the second tool component causing the second tool component to, upon receiving the command signal, generate a short for a first predetermined period of time along a length of the wire between the first tool component and the second tool component, wherein the short results in a smaller impedance than the characteristic line impedance (<<Zo) along the length of wire between the first tool component and the second tool component.

7. The apparatus according to claim 2, wherein the impedance altering devices are configured to alter, for a first predetermined period of time, at least one of the source impedance and the load impedance such that the source impedance is greater than the characteristic line impedance (>>Zo) and the load impedance is less than the characteristic line impedance (<<Zo).

8. The apparatus according to claim 2, wherein the impedance altering devices are configured to alter, for a first predetermined period of time, at least one of the source impedance and the load impedance such that the load impedance is either greater than the source characteristic line impedance (>>Zo) or less than the characteristic line impedance (<<Zo).

9. The apparatus according to claim 1, further comprising a third tool component spaced apart from the first and second tool components, the wire communicatively coupling the third tool component with the first tool component, wherein:
   the wire has a third termination point coupled to the third tool component, the third termination point having a second load impedance;
   third tool component includes a third impedance altering device, the third impedance altering device configured to alter, for a second predetermined period of time, at least one of the source impedance and the second load impedance sufficient to generate a second characteristic signal reflection upon the transmission of a second signal along a length of wire between the first tool component and the third tool component;
   the first tool component is configured to transmit a second clock signal along the length of wire between the first tool component and the third tool component during the second predetermined period of time; and
   the first tool component is configured to receive one or more reflections of the second clock signal during the second predetermined period of time.

10. The apparatus according to claim 9, wherein the computing device identifies:
   a second propagation delay based on the one or more reflections of the second clock signal.

11. The apparatus according to claim 10, wherein the computing device is further configured to identify:

a first wire integrity characteristic based on the one or more reflected clock signals reflected during the first predetermined period of time; and a second wire integrity characteristic based on the one or more reflections of the second clock signal.

12. The apparatus according to claim 1, wherein the first tool component includes a line driver and the first impedance altering device includes a source resistor, and the line driver is configured to transmit the clock signal through the source resistor.

13. The apparatus according to claim 12, wherein the first tool component further includes:

a counter circuit; and a detector located between the source resistor and the second tool component, the detector configured to convert the at least one of the one or more reflected clock signals to a square wave or a clean edge/pulse, wherein operation of the counter circuit facilitates identification of a frequency of the converted reflected clock signal or facilitates measurement of a round trip time associated with transmission of the clock signal and reception of the one or more reflected clock signals.

14. The apparatus according to claim 1, wherein the first tool component includes a transmitter and the second tool component includes a receiver of a resistivity logging tool.

15. The apparatus according to claim 1, wherein the wire between the first tool component and the second tool component comprises a length of at least 25 feet.

16. A method comprising:

altering, for a first predetermined period of time, at least one of a source impedance of a first end of a wire and a load impedance of a second end of the wire, said altering sufficient to generate a characteristic signal reflection upon transmission of a signal along a length of wire between a first tool component and a second tool component;

transmitting, from the first tool component, during the first predetermined period of time, a clock signal along the length of the wire between the first tool component and the second tool component;

receiving, at the first tool component, one or more reflected clock signals reflected during the first predetermined period of time; and identifying a propagation delay associated with the one or more reflected clock signals, wherein a measurement associated with at least one of the first tool component or the second tool component is corrected based on the identified propagation delay.

17. The method according to claim 16, further comprising transmitting from the first tool component, a clock synchronization signal to the second tool component, based on the propagation delay.

18. The method according to claim 16, wherein the corrected measurement is a tool measurement.

19. The method according to claim 16, wherein the measurement is a resistivity measurement made based on the first tool component including a transmitter and the second tool component including a receiver.

20. The method according to claim 19, further comprising identifying a phase correction of the resistivity measurement.

21. A method of monitoring Phell integrity of a downhole wire, the method comprising:

altering, for a first predetermined period of time, at least one of a source impedance of a first end of the wire and a load impedance of a second end of the wire, said altering sufficient to generate a characteristic signal reflection upon transmission of a signal along a length of the wire between a first tool component and a second tool component;

transmitting, from the first tool component, during the first predetermined period of time, a clock signal along the length of the wire between the first tool component and the second tool component;

receiving, at the first tool component, one or more reflected clock signals reflected during the first predetermined period of time; and identifying a wire integrity characteristic based on the one or more reflected clock signals reflected during the first predetermined period of time, wherein a measurement associated with at least one of the first tool component or the second tool component is corrected based on the identified wire integrity characteristic.

22. The method according to claim 21, wherein the wire integrity characteristic is selected from the group consisting of a change in propagation delay, a change in reflected signal amplitude or frequency, a change in decay of the reflected signal, and a change in a reflection coefficient.

23. The method according to claim 21, further comprising modifying an operational parameter based upon the wire integrity characteristic.

24. The method according to claim 21, wherein the wire integrity characteristic corresponds to an integrity of a bus of a resistivity tool, the method further comprising altering a resistivity logging tool operational parameter based on the wire integrity characteristic.

25. A system comprising:

a wire;

a first tool component that includes a first impedance altering device that is controllably coupled to a first termination point of the wire via a first switch;

a second tool component that includes a second impedance altering device that is controllably coupled to a second termination point of the wire via a second switch;

a third tool component that includes a third impedance altering device that is controllably coupled to a third termination point of the wire via a third switch, wherein the first tool component, the second tool component, and the third tool component are spaced apart along a wellbore; and a computing device coupled to the first tool component that controls one or more of the first switch the second switch and the third switch to:

alter, for a first predetermined period of time, at least one of a source impedance or a first load impedance such that a first characteristic signal reflection is generated upon transmission of a first signal along a length of wire between the first tool component and the second tool component, alter, for a second period of time, at least one of the source impedance and the second load impedance such that a second characteristic signal reflection is generated upon the transmission of a second signal along a length of wire between the first tool component and the third tool component, wherein:

the first tool component transmits a first clock signal along the length of wire between the first tool component and the second tool component during the first predetermined period of time, the first tool component transmits a second clock signal along the length of wire between the first tool component and the third tool component during the second predetermined period of time, the computing device identifies a first propagation delay or a first wire integrity characteristic based on a first set of one or more reflected clock signals reflected during the first predetermined period of time, the identification of the first propagation delay or the first wire integrity characteristic results in a measurement associated with at least one of the first tool component or the second tool component being corrected, and the computing device identifies a second propagation delay or a second wire integrity characteristic based on a second set of one or more reflected clock signals reflected during the second predetermined period of time.

* * * * *